US011915645B2

(12) United States Patent
Wang et al.

(10) Patent No.: US 11,915,645 B2
(45) Date of Patent: Feb. 27, 2024

(54) DISPLAY PANEL INCLUDING EXTENSION PORTION, PIXEL CIRCUIT INCLUDING VOLTAGE STABILIZING SUB-CIRCUITS AND DISPLAY APPARATUS

(71) Applicants: Chongqing BOE Display Technology Co., Ltd., Chongqing (CN); BOE TECHNOLOGY GROUP CO., LTD., Beijing (CN)

(72) Inventors: Wentao Wang, Beijing (CN); Dawei Shi, Beijing (CN); Dongsheng Zhao, Beijing (CN); Lu Yang, Beijing (CN); Pei Wang, Beijing (CN)

(73) Assignees: CHONGQING BOE DISPLAY TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 202 days.

(21) Appl. No.: 17/620,599

(22) PCT Filed: Dec. 25, 2020

(86) PCT No.: PCT/CN2020/139265

§ 371 (c)(1),
(2) Date: Dec. 17, 2021

(87) PCT Pub. No.: WO2022/133978

PCT Pub. Date: Jun. 30, 2022

(65) Prior Publication Data

US 2022/0406254 A1 Dec. 22, 2022

(51) Int. Cl.
*G09G 3/3233* (2016.01)

(52) U.S. Cl.
CPC ... *G09G 3/3233* (2013.01); *G09G 2300/0426* (2013.01); *G09G 2300/0819* (2013.01);
(Continued)

(58) Field of Classification Search
CPC ......... G09G 3/3233; G09G 2300/0426; G09G 2300/0819; G09G 2300/0842;
(Continued)

(56) References Cited

U.S. PATENT DOCUMENTS 10,490,128 B1 * 11/2019 Qian .................... G09G 3/3266
2012/0019504 A1 1/2012 Han et al.
(Continued)

FOREIGN PATENT DOCUMENTS

CN 110992880 A 4/2020
CN 111477179 A 7/2020
(Continued)

*Primary Examiner* — Kwang-Su Yang
(74) *Attorney, Agent, or Firm* — IP & T GROUP LLP

(57) ABSTRACT

A display panel includes a base, a plurality of sub-pixels and a plurality of gate control lines that are disposed on the base. Each sub-pixel includes a pixel circuit. The pixel circuit includes a driving transistor and at least one first switching transistor electrically connected to a control electrode of the driving transistor. Each pixel circuit is electrically connected to at least two gate control lines. A first switching transistor includes an active layer. The active layer includes an active layer body and at least one extension portion, and the active layer body includes at least one channel portion and at least one conductive portion. An extension portion is electrically connected to a conductive portion of the active layer body. At least a portion of an orthogonal projection of the extension portion on the base is overlapped with an orthogonal projection of a gate control line on the base.

16 Claims, 19 Drawing Sheets

(52) U.S. Cl.
CPC . *G09G 2300/0842* (2013.01); *G09G 2310/08* (2013.01); *G09G 2320/0223* (2013.01); *G09G 2320/0233* (2013.01)

(58) Field of Classification Search
CPC ....... G09G 2310/08; G09G 2320/0223; G09G 2320/0233
See application file for complete search history.

(56) References Cited

U.S. PATENT DOCUMENTS

2017/0011685 A1* 1/2017 Jeon .................. H10K 59/1213
2017/0061883 A1* 3/2017 Lee .................. H01L 29/78621

FOREIGN PATENT DOCUMENTS

CN 111613177 A 9/2020
CN 111627387 A 9/2020
CN 110992880 B * 4/2021 ........... G09G 3/3208

* cited by examiner

VINT

DISPLAY PANEL INCLUDING EXTENSION PORTION, PIXEL CIRCUIT INCLUDING VOLTAGE STABILIZING SUB-CIRCUITS AND DISPLAY APPARATUS

CROSS-REFERENCE TO RELATED APPLICATION

This application is a national phase entry under 35 USC 371 of International Patent Application No. PCT/CN2020/139265 filed on Dec. 25, 2020, which is incorporated herein by reference in its entirety.

TECHNICAL FIELD

The present disclosure relates to the field of display technologies, and in particular, to a display panel, a pixel circuit and a display apparatus.

BACKGROUND

At present, organic light-emitting diode (OLED) display apparatuses are widely used due to their characteristics of self-luminescence, fast response, wide viewing angle and capability of being manufactured on a flexible base. The OLED display apparatus includes a plurality of sub-pixels. Each sub-pixel includes a pixel circuit and a light-emitting device, and the light-emitting device is driven by the pixel circuit to emit light, thereby achieving display.

SUMMARY

In an aspect, a display panel is provided, including: a base, a plurality of sub-pixels disposed on the base and a plurality of gate control lines disposed on the base. Each sub-pixel includes a pixel circuit; the pixel circuit includes a driving transistor and at least one first switching transistor, and the at least one first switching transistor is electrically connected to a control electrode of the driving transistor. Each pixel circuit is electrically connected to at least two gate control lines. A first switching transistor includes an active layer, the active layer includes an active layer body and at least one extension portion, and the active layer body includes at least one channel portion and at least one conductive portion. An extension portion is electrically connected to a conductive portion of the active layer body; at least a portion of an orthogonal projection of the extension portion on the base is overlapped with an orthogonal projection of a gate control line on the base.

In some embodiments, the at least one extension portion includes at least one first extension portion; the active layer body of the first switching transistor includes two channel portions and three conductive portions, the three conductive portions and the two channel portions are electrically connected alternately in sequence; the orthogonal projection of the gate control line on the base is overlapped with orthogonal projections of the two channel portions of the first switching transistor on the base. A first extension portion of the first switching transistor is electrically connected to a conductive portion located between the two channel portions of the first switching transistor, and at least a portion of an orthogonal projection of the first extension portion of the first switching transistor on the base is overlapped with the orthogonal projection of the gate control line on the base.

In some embodiments, the three conductive portions of the first switching transistor are a first conductive portion, a second conductive portion and a third conductive portion, and the second conductive portion is located between the two channel portions of the first switching transistor. One end of the first extension portion is electrically connected to the second conductive portion, and another end of the first extension portion extends in a direction away from the second conductive portion; the first extension portion is located between the first conductive portion and the third conductive portion, or on a side of the active layer body of the first switching transistor.

In some embodiments, the at least one extension portion further includes at least one second extension portion; one of two conductive portions, located at two ends, of the first switching transistor is electrically connected to the control electrode of the driving transistor; a second extension portion of the first switching transistor is electrically connected to the conductive portion that is electrically connected to the control electrode of the driving transistor in the three conductive portions, and at least a portion of an orthogonal projection of the second extension portion of the first switching transistor on the base is overlapped with the orthogonal projection of the gate control line on the base.

In some embodiments, the three conductive portions of the first switching transistor are a first conductive portion, a second conductive portion and a third conductive portion, and the second conductive portion is located between the two channel portions of the first switching transistor; the first conductive portion is electrically connected to the control electrode of the driving transistor. One end of the second extension portion is electrically connected to the first conductive portion, and another end of the second extension portion extends in a direction away from the first conductive portion; the second extension portion is located between the first conductive portion and the third conductive portion, or on a side of the active layer body of the first switching transistor.

In some embodiments, the at least one extension portion includes at least one third extension portion; the active layer body of the first switching transistor includes a third channel portion, a fourth conductive portion and a fifth conductive portion, and the fourth conductive portion and the fifth conductive portion are located on opposite sides of the third channel portion; the fourth conductive portion is electrically connected to the control electrode of the driving transistor; and a third extension portion is electrically connected to the fourth conductive portion, and at least a portion of an orthogonal projection of the third extension portion on the base is overlapped with the orthogonal projection of the gate control line on the base.

In some embodiments, the at least one extension portion further includes at least one fourth extension portion; a fourth extension portion is electrically connected to the fifth conductive portion, and at least a portion of an orthogonal projection of the fourth extension portion on the base is overlapped with the orthogonal projection of the gate control line on the base.

In some embodiments, the display panel further includes a plurality of initialization signal lines, and each pixel circuit is further electrically connected to at least one initialization signal line. The at least two gate control lines electrically connected to the pixel circuit includes a first reset signal line. The at least one first switching transistor includes a first transistor; a control electrode of the first transistor is electrically connected to the first reset signal line, a first electrode of the first transistor is electrically connected to an initialization signal line, and a second electrode of the first transistor is electrically connected to the control electrode of the driving transistor. At least a portion of an orthogonal projection of the extension portion of the first transistor on the base is overlapped with an orthogonal projection of the first reset signal line on the base.

In some embodiments, the at least two gate control lines electrically connected to the pixel circuit further includes a gate scan line. The at least one first switching transistor further includes a second transistor; a control electrode of the second transistor is electrically connected to the gate scan line, a first electrode of the second transistor is electrically connected to a second electrode of the driving transistor, and a second electrode of the second transistor is electrically connected to the control electrode of the driving transistor. At least a portion of an orthogonal projection of an extension portion of the second transistor on the base is overlapped with an orthogonal projection of the gate scan line on the base; or at least a portion of the orthogonal projection of the extension portion of the second transistor on the base is overlapped with the orthogonal projection of the first reset signal line on the base.

In some embodiments, the display panel further includes a plurality of first voltage signal lines, a plurality of light-emitting control lines and a plurality of data lines. The at least two gate control lines electrically connected to the pixel circuit includes a second reset signal line. Each pixel circuit is further electrically connected to a first voltage signal line.

The pixel circuit further includes a storage capacitor; the storage capacitor includes a first electrode plate and a second electrode plate arranged opposite to each other; the first electrode plate and the plurality of gate control lines are disposed in a same layer, and the first electrode plate is electrically connected to the control electrode of the driving transistor; the second electrode plate is disposed on a side of the first electrode plate away from the base; the second electrode plate is electrically connected to the first voltage signal line.

Each pixel circuit is electrically connected to a light-emitting control line, a data line and the second reset signal line; the pixel circuit further includes at least one second switching transistor, and each second switching transistor is electrically connected to a first electrode or a second electrode of the driving transistor.

In another aspect, a pixel circuit is provided, including a driving sub-circuit, a storage sub-circuit, a first reset sub-circuit, a compensation sub-circuit, a first voltage stabilizing sub-circuit and a second voltage stabilizing sub-circuit.

The driving sub-circuit is configured to generate a driving current. The storage sub-circuit is electrically connected to the driving sub-circuit and a first voltage signal line; the storage sub-circuit is configured to store a received signal and maintain a potential of a terminal, connected to the driving sub-circuit, of the storage sub-circuit. The first reset sub-circuit is electrically connected to a first reset signal line, the driving sub-circuit and an initialization signal line; the reset sub-circuit is configured to transmit an initialization signal received at the initialization signal line to the driving sub-circuit in response to a first reset signal received at the first reset signal line. The compensation sub-circuit is electrically connected to the driving sub-circuit and a gate scan line; the compensation sub-circuit is configured to perform threshold compensation on the driving sub-circuit in response to a gate scan signal received at the gate scan line.

The first voltage stabilizing sub-circuit is electrically connected to the first reset sub-circuit, and one of the first reset signal line and the gate scan line; the first voltage stabilizing sub-circuit is configured to suppress leakage of the first reset sub-circuit. The second voltage stabilizing sub-circuit is electrically connected to the compensation sub-circuit, and one of the first reset signal line and the gate scan line; the second voltage stabilizing sub-circuit is configured to suppress leakage of the compensation sub-circuit.

In some embodiments, the driving sub-circuit includes a driving transistor; the first voltage stabilizing sub-circuit includes at least one first voltage stabilizing capacitor. The first reset sub-circuit includes a first sub-transistor and a second sub-transistor. A control electrode of the first sub-transistor is electrically connected to the first reset signal line, a first electrode of the first sub-transistor is electrically connected to the initialization signal line, and a second electrode of the first sub-transistor is electrically connected to a first electrode of the second sub-transistor. A control electrode of the second sub-transistor is electrically connected to the first reset signal line, and a second electrode of the second sub-transistor is electrically connected to a control electrode of the driving transistor. A first end of the first voltage stabilizing capacitor is electrically connected to the second electrode of the first sub-transistor, and a second end of the first voltage stabilizing capacitor is electrically connected to the first reset signal line.

In some embodiments, the first voltage stabilizing sub-circuit further includes at least one second voltage stabilizing capacitor; a first end of the second voltage stabilizing capacitor is electrically connected to the second electrode of the second sub-transistor, and a second end of the second voltage stabilizing capacitor is electrically connected to the first reset signal line or the gate scan line.

In some embodiments, the driving sub-circuit includes a driving transistor; the first voltage stabilizing sub-circuit includes at least one third voltage stabilizing capacitor and at least one fourth voltage stabilizing capacitor. The first reset sub-circuit includes a first transistor; a control electrode of the first transistor is electrically connected to the first reset signal line, a first electrode of the first transistor is electrically connected to the initialization signal line, and a second electrode of the first transistor is electrically connected to a control electrode of the driving transistor. A first end of the third voltage stabilizing capacitor is electrically connected to the second electrode of the first transistor, and a second end of the third voltage stabilizing capacitor is electrically connected to the first reset signal line or the gate scan line. A first end of the fourth voltage stabilizing capacitor is electrically connected to the first electrode of the first transistor, and a second end of the fourth voltage stabilizing capacitor is electrically connected to the first reset signal line or the gate scan line.

In some embodiments, the driving sub-circuit includes a driving transistor; the second voltage stabilizing sub-circuit includes at least one fifth voltage stabilizing capacitor. The compensation sub-circuit includes a third sub-transistor and a fourth sub-transistor. A control electrode of the third sub-transistor is electrically connected to the gate scan line, a first electrode of the third sub-transistor is electrically connected to a second electrode of the driving transistor, and a second electrode of the third sub-transistor is electrically connected to a first electrode of the fourth sub-transistor. A control electrode of the fourth sub-transistor is electrically connected to the gate scan line, and a second electrode of the fourth sub-transistor is electrically connected to a control electrode of the driving transistor. A first end of the fifth voltage stabilizing capacitor is electrically connected to the second electrode of the third sub-transistor, and a second end of the fifth voltage stabilizing capacitor is electrically connected to the first reset signal line or the gate scan line.

In some embodiments, the second voltage stabilizing sub-circuit further includes at least one sixth voltage stabilizing capacitor. A first end of the sixth voltage stabilizing capacitor is electrically connected to the second electrode of the fourth sub-transistor, and a second end of the sixth voltage stabilizing capacitor is electrically connected to the first reset signal line or the gate scan line.

In some embodiments, the driving sub-circuit includes a driving transistor; the second voltage stabilizing sub-circuit includes at least one seventh voltage stabilizing capacitor and at least one eighth voltage stabilizing capacitor. The compensation sub-circuit includes a second transistor; a control electrode of the second transistor is electrically connected to the gate scan line, a first electrode of the second transistor is electrically connected to a second electrode of the driving transistor, and a second electrode of the second transistor is electrically connected to a control electrode of the driving transistor. A first end of the seventh voltage stabilizing capacitor is electrically connected to the second electrode of the second transistor, and a second end of the seventh voltage stabilizing capacitor is electrically connected to the first reset signal line or the gate scan line. A first end of the eighth voltage stabilizing capacitor is electrically connected to the first electrode of the second transistor, and a second end of the eighth voltage stabilizing capacitor is electrically connected to the first reset signal line or the gate scan line.

In some embodiments, the pixel circuit further includes a data writing sub-circuit, a second reset sub-circuit, a first light-emitting control sub-circuit and a second light-emitting control sub-circuit. The data writing sub-circuit is electrically connected to the gate scan line, a data line and the driving sub-circuit; the data writing sub-circuit is configured to transmit a data signal received at the data line to the driving sub-circuit in response to the gate scan signal received at the gate scan line. The driving sub-circuit and the compensation sub-circuit are further configured to transmit the data signal to the storage sub-circuit.

The second reset sub-circuit is electrically connected to a second reset signal line, the initialization signal line and a light-emitting device; the second reset sub-circuit is configured to transmit the initialization signal received at the initialization signal line to the light-emitting device in response to a second reset signal received at the second reset signal line. The first light-emitting control sub-circuit is electrically connected to a light-emitting control line, the first voltage signal line and the driving sub-circuit; the first light-emitting control sub-circuit is configured to transmit a first voltage signal received at the first voltage signal line to the driving sub-circuit in response to a light-emitting control signal received at the light-emitting control line. The second light-emitting control sub-circuit is electrically connected to the light-emitting control line, the driving sub-circuit and the light-emitting device; the second light-emitting control sub-circuit is configured to transmit the driving current generated by the driving sub-circuit to the light-emitting device, so as to control the light-emitting device to emit light.

In yet another aspect, a display apparatus is provided, including the display panel as described in any of the above embodiments.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

FIG. 1 is a diagram showing a structure of a display apparatus, in accordance with some embodiments;

DETAILED DESCRIPTION

Figure 2:
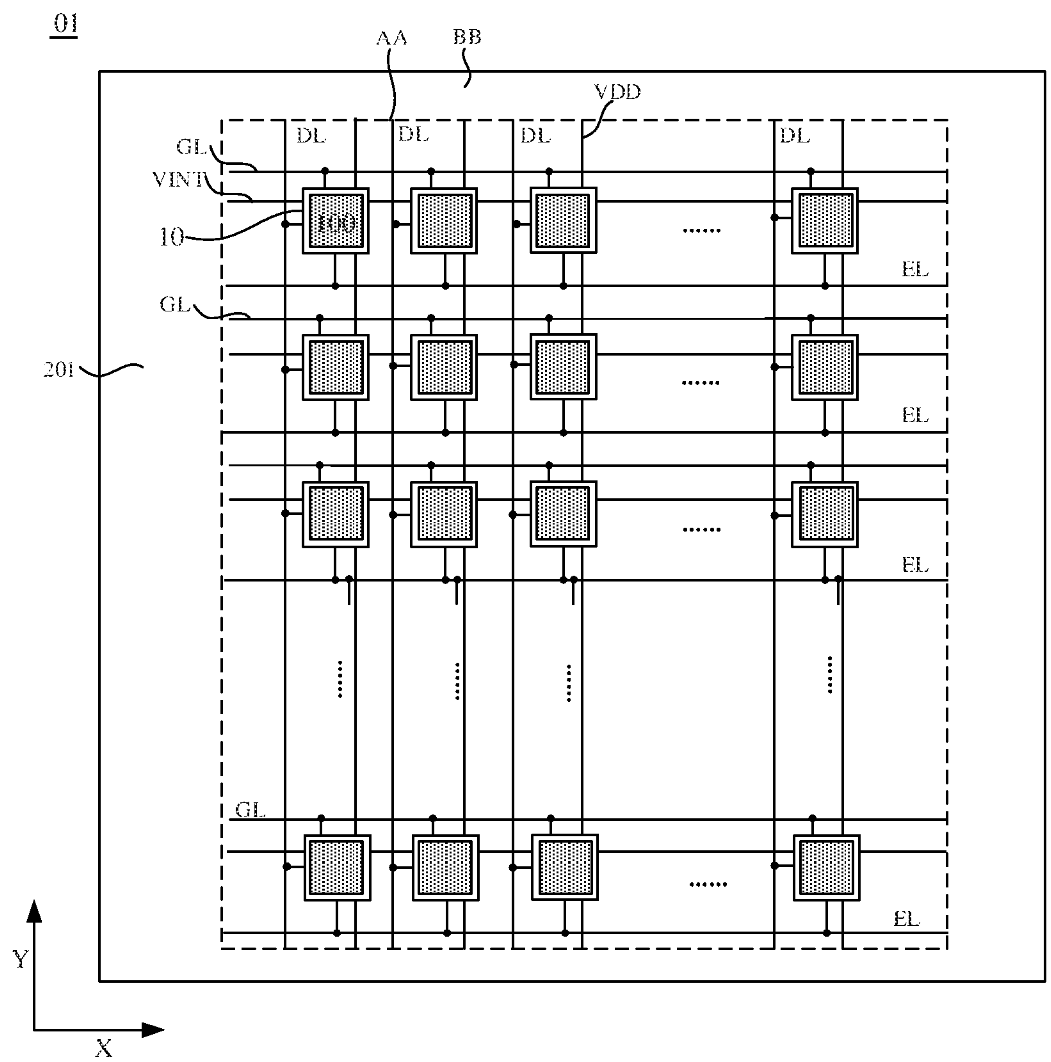
FIG. 2 is a diagram showing a structure of a display panel, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term “comprise” and other forms thereof such as the third-person singular form “comprises” and the present participle form “comprising” are construed as an open and inclusive meaning, i.e., “including, but not limited to.” In the description of the specification, the terms such as “one embodiment”, “some embodiments”, “exemplary embodiments”, “example”, “specific example” or “some examples” are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as “first” and “second” are only used for descriptive purposes, and are not to be construed as indicating or implying relative importance or implicitly indicating the number of indicated technical features. Thus, a feature defined by “first” or “second” may explicitly or implicitly include one or more of the features. In the description of the embodiments of the present disclosure, the term “a plurality of” or “the plurality of” means two or more unless otherwise specified.

In the description of some embodiments, terms “coupled” and “connected” and their extensions may be used. For example, the term “connected” may be used in the description of some embodiments to indicate that two or more components are in direct physical contact or electrical contact with each other. For another example, the term “coupled” may be used in the description of some embodiments to indicate that two or more elements are in direct physical or electrical contact. However, the term “coupled” or “communicatively coupled” may also mean that two or more elements are not in direct contact with each other, but still cooperate or interact with each other. The embodiments disclosed herein are not necessarily limited to the contents herein.

As used herein, depending on the context, the term “if” is optionally construed as “when” or “in a case where” or “in response to determining that” or “in response to detecting that”. Similarly, depending on the context, the phrase “if it is determined that” or “if [a stated condition or event] is detected” is optionally construed as “in a case where it is determined that” or “in response to determining that” or “in a case where [the stated condition or event] is detected” or “in response to detecting [the stated condition or event]”.

The use of the phase “applicable to” or “configured to” herein means an open and inclusive language, which does not exclude devices that are applicable to or configured to perform additional tasks or steps.

In addition, the use of the phrase “based on” is meant to be open and inclusive, since a process, step, calculation or other action that is “based on” one or more of the stated conditions or values may, in practice, be based on additional conditions or values exceeding those stated.

Terms such as “about”, “substantially” or “approximately” as used herein include a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Figure 1:
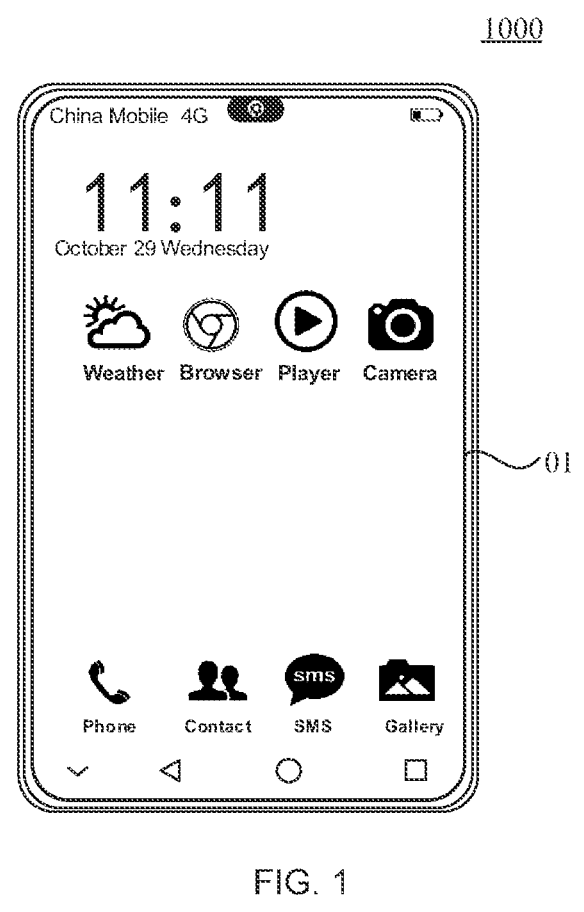

Some embodiments of the present disclosure provide a display apparatus. The display apparatus may be, for example, a mobile phone, a tablet computer, a personal digital assistant (PDA), a television, a vehicle-mounted computer, a wearable display device such as a watch, etc. As shown in FIG. 1, the display apparatus 1000 may be a mobile phone. The embodiments of the present disclosure do not specifically limit a specific form of the display apparatus.

In some examples, the display apparatus may be an electroluminescent display apparatus or a photoluminescent display apparatus. In a case where the display apparatus is an electroluminescent display apparatus, the electroluminescent display apparatus may be an organic light-emitting diode (OLED) display apparatus or a quantum dot light-emitting diode (QLED) display apparatus. In a case where the display apparatus is a photoluminescent display apparatus, the photoluminescent display apparatus may be a quantum dot photoluminescent display apparatus.

The display apparatus 1000 includes a display panel 01. As shown in FIG. 2, the display panel 01 includes a display area AA (an AA area for short) and a peripheral area BB located on at least one side of the display area AA.

In some embodiments, the display panel 01 includes a base 201, a plurality of sub-pixels 10 disposed on the base 201, a plurality of gate control lines GL, a plurality of data lines DL, a plurality of initialization signal lines VINT and a plurality of first voltage signal lines VDD. For example, the plurality of gate control lines GL and the plurality of initialization signal lines VINT extend in a horizontal direction X, and the plurality of data lines DL and the plurality of first voltage signal lines VDD extend in a vertical direction Y. The plurality of sub-pixels 10, the plurality of gate control lines GL, the plurality of data lines DL, the plurality of initialization signal lines VINT and the plurality of first voltage signal lines VDD are all disposed in the display area AA.

For convenience of description, the plurality of sub-pixels 10 are described by taking an example in which they are arranged in a matrix form. For example, the plurality of sub-pixels 10 are arranged in N rows and M columns. In this case, sub-pixels 10 arranged in a line along the horizontal direction X are referred to as a row of sub-pixels, and sub-pixels 10 arranged in a line along the vertical direction Y are referred to as a column of sub-pixels. Each sub-pixel 10 includes a light-emitting device and a pixel circuit 100 for controlling the light-emitting device to emit light, and the pixel circuit 100 is disposed on the base 201 of the display panel 01. A row of sub-pixels may be coupled to one or two gate control lines GL. For example, each pixel circuit 100 is electrically connected to at least two gate control lines GL. A row of sub-pixels may also be coupled to one or two light-emitting control lines EL, and a column of sub-pixels may be coupled to a data signal line DL.

The display panel 01 may be an organic light-emitting diode (OLED) display panel, a quantum dot light-emitting diode (QLED) display panel, etc., which is not specifically limited in the embodiments of the present disclosure.

The following embodiments of the present disclosure are all described by taking an example in which the display panel 01 is the OLED display panel.

For example, the pixel circuit 100 generally includes components such as a switching transistor, a driving transistor and a storage capacitor. Opposite ends of the storage capacitor are a reference potential end and a signal holding end. For example, the reference potential end of the storage capacitor is electrically connected to the first voltage signal line VDD, and the signal holding end of the storage capacitor is coupled to a control electrode (gate) of the driving transistor.

In a driving process of the pixel circuit 100, in a light-emitting phase, the storage capacitor is used to hold a voltage signal, so that the potential of the signal holding end of the storage capacitor is kept constant, and a voltage is developed between the gate and a source of the driving transistor, thereby controlling the driving transistor to produce a driving current to drive the light-emitting diode to emit light. In this process, in a theoretical circumstance, the switching transistor electrically connected to the control electrode of the driving transistor is in an off state, and there is no current flowing through the switching transistor, so that the potential of the signal holding end may be kept stable. However, in an actual circuit, the switching transistor has a leakage current in the off state, and the leakage current of the switching transistor is obvious due to an influence of process abnormity. As a result, the potential of the signal holding end of the storage capacitor cannot be kept constant for a long time, which causes the driving current produced by the driving transistor to be unstable, thereby affecting a light-emitting brightness of the light-emitting device, and further affecting the display effect of the display apparatus.

Figure 3A:
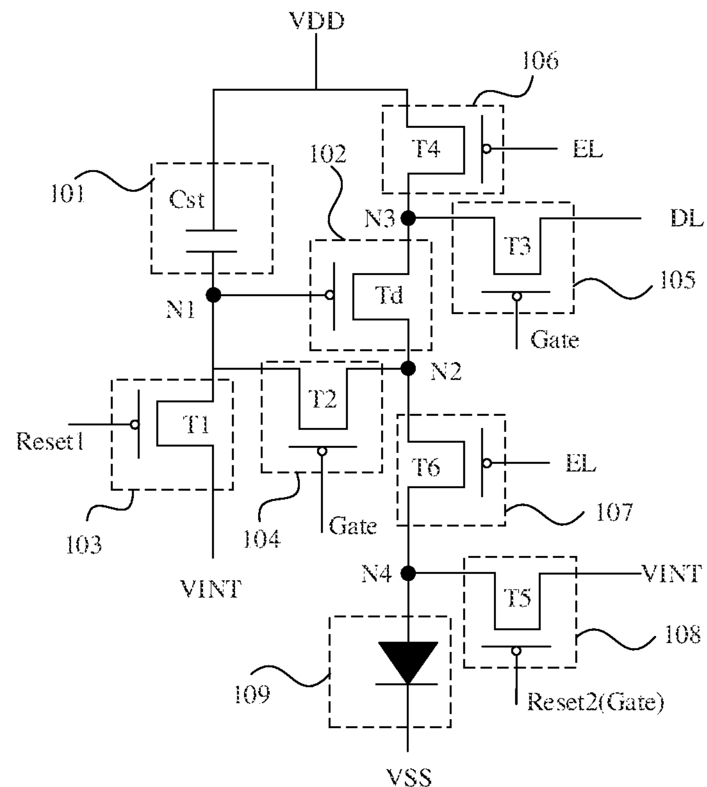
FIG. 3A is a diagram showing a structure of a sub-pixel, in accordance with some embodiments.
Figure 3B:
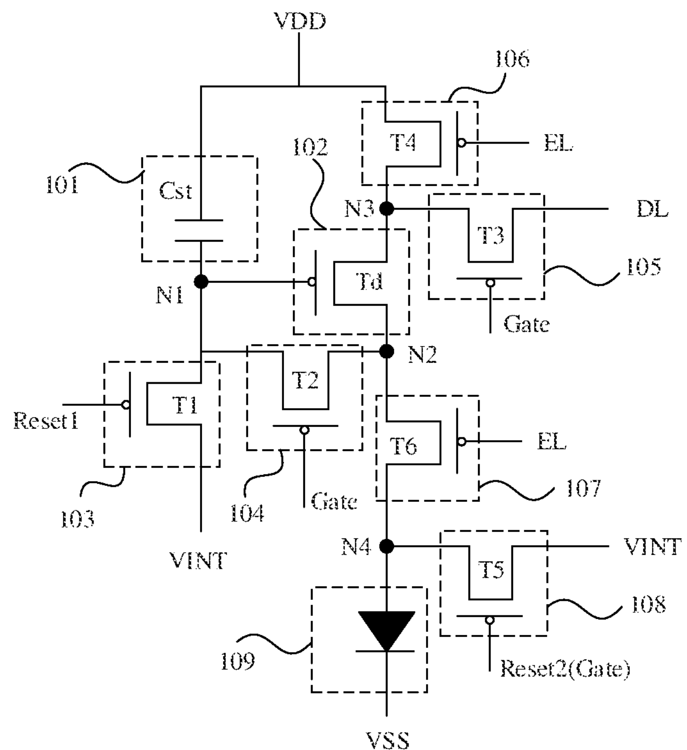
FIG. 3B is a diagram showing a structure of another sub-pixel, in accordance with some embodiments.

As shown in FIGS. 3A and 3B, some embodiments of the present disclosure provide a pixel circuit 100. The pixel circuit 100 includes a storage sub-circuit 101, a driving sub-circuit 102, a first reset sub-circuit 103, a compensation sub-circuit 104, a data writing sub-circuit 105, a first light-emitting control sub-circuit 106, a second light-emitting control sub-circuit 107 and a second reset sub-circuit 108.

The driving sub-circuit 102 is configured to generate a driving current.

The storage sub-circuit 101 is electrically connected to the driving sub-circuit 102 and a first voltage signal line VDD. The storage sub-circuit 101 is configured to store a received signal and maintain a potential of an end, connected to the driving sub-circuit 102, of the storage sub-circuit 101.

The first reset sub-circuit 103 is electrically connected to the driving sub-circuit 102, a first reset signal line Reset1 and an initialization signal line VINT. The first reset sub-circuit 103 is configured to transmit an initialization signal received at the initialization signal line VINT to the driving sub-circuit 102 in response to a first reset signal received at the first reset signal line Reset1.

The compensation sub-circuit 104 is electrically connected to the driving sub-circuit 102 and a gate scan line Gate. The compensation sub-circuit 104 is configured to perform threshold compensation on the driving sub-circuit 102 in response to a gate scan signal received at the gate scan line Gate.

As shown in FIGS. 3A and 3B, hereinafter, a node where the driving sub-circuit 102, the storage sub-circuit 101, the first reset sub-circuit 103 and the compensation sub-circuit 104 are electrically connected is referred to as a first node N1. The first reset sub-circuit 103 can transmit the initialization signal to the first node N1, so as to reset the first node N1.

For example, the storage sub-circuit 101 includes a storage capacitor Cst. A second end of the storage capacitor Cst is electrically connected to the first voltage signal line VDD, and a first end of the storage capacitor Cst is electrically connected to the first node N1.

The driving sub-circuit 102 includes a driving transistor Td. A control electrode of the driving transistor Td is electrically connected to the first node N1.

The first reset sub-circuit 103 includes a first transistor T1. A control electrode of the first transistor T1 is electrically connected to the first reset signal line Reset1, a first electrode of the first transistor T1 is electrically connected to the initialization signal line VINT, and a second electrode of the first transistor T1 is electrically connected to the first node N1.

In some examples, as shown in FIG. 3B, the first transistor T1 is a dual-gate transistor, and the first transistor T1 includes a first sub-transistor T11 and a second sub-transistor T12. A control electrode of the first sub-transistor T11 is electrically connected to the first reset signal line Reset1, a first electrode of the first sub-transistor T11 is electrically connected to the initialization signal line VINT, and a second electrode of the first sub-transistor T11 is electrically connected to a first electrode of the second sub-transistor T12. A control electrode of the second sub-transistor T12 is electrically connected to the first reset signal line Reset1, and a second electrode of the second sub-transistor T12 is electrically connected to the control electrode of the driving transistor Td. It may be understood that, the control electrode of the first transistor T1 is control electrodes of both the first sub-transistor T11 and the second sub-transistor T12, the first electrode of the first transistor T1 is the first electrode of the first sub-transistor T11, and the second electrode of the first transistor T1 is the second electrode of the second sub-transistor T12.

The compensation sub-circuit 104 includes a second transistor T2. A control electrode of the second transistor T2 is electrically connected to the gate scan line Gate, a first electrode of the second transistor T2 is electrically connected to a second electrode of the driving transistor Td, and a second electrode of the second transistor T2 is electrically connected to the first node N1.

In some examples, as shown in FIG. 3B, the second transistor T2 is a dual-gate transistor, and the second transistor T2 includes a third sub-transistor T21 and a fourth sub-transistor T22. A control electrode of the third sub-transistor T21 is electrically connected to the gate scan line Gate, a first electrode of the third sub-transistor T21 is electrically connected to the second electrode of the driving transistor Td, and a second electrode of the third sub-transistor T21 is electrically connected to a first electrode of the fourth sub-transistor T22. A control electrode of the fourth sub-transistor T22 is electrically connected to the gate scan line Gate, and a second electrode of the fourth sub-transistor T22 is electrically connected to the control electrode of the driving transistor Td. It may be understood that, the control electrode of the second transistor T2 is control electrodes of both the third sub-transistor T21 and the fourth sub-transistor T22, the first electrode of the second transistor T2 is the first electrode of the third sub-transistor T21, and the second electrode of the second transistor T2 is the second electrode of the fourth sub-transistor T22.

Hereinafter, a node where the first electrode of the second transistor T2 is electrically connected to the second electrode of the driving transistor Td is referred to as a second node N2.

The data writing sub-circuit 105 is electrically connected to the gate scan line Gate, the driving sub-circuit 102 and a data line DL, and the data writing sub-circuit 105 is configured to transmit a data signal received at the data line DL to the driving sub-circuit 102 in response to the gate scan signal received at the gate scan line Gate.

The first light-emitting control sub-circuit 106 is electrically connected to a light-emitting control line EL, the first voltage signal line VDD and the driving sub-circuit 102. The first light-emitting control sub-circuit 106 is configured to transmit a first voltage signal received at the first voltage signal line VDD to the driving sub-circuit 102 in response to a light-emitting control signal received at the light-emitting control line EL.

Hereinafter, a node where the driving sub-circuit 102 is electrically connected to the data writing sub-circuit 105 and the first light-emitting control sub-circuit 106 is referred to as a third node N3.

For example, the data writing sub-circuit 105 includes a third transistor T3. A control electrode of the third transistor T3 is electrically connected to the gate scan line Gate, a first electrode of the third transistor T3 is electrically connected to the data line DL, and a second electrode of the third transistor T3 is electrically connected to the third node N3.

The first light-emitting control sub-circuit 106 includes a fourth transistor T4. A control electrode of the fourth transistor T4 is electrically connected to the light-emitting control line EL, a first electrode of the fourth transistor T4 is electrically connected to the first voltage signal line VDD, and a second electrode of the fourth transistor T4 is electrically connected to the third node N3.

The second reset sub-circuit 108 is electrically connected to a second reset signal line Reset2, the initialization signal line VINT and a light-emitting device 109. The second reset sub-circuit 108 is configured to transmit the initialization signal received at the initialization signal line VINT to the light-emitting device 109 in response to a second reset signal received at the second reset signal line Reset2, so as to reset the light-emitting device 109.

The second light-emitting control sub-circuit 107 is electrically connected to the light-emitting control line EL, the driving sub-circuit 102 and the light-emitting device 109. The second light-emitting control sub-circuit 107 is configured to receive a driving signal output by the driving sub-circuit 102 and transmit the driving signal to the light-emitting device 109 in response to the light-emitting control signal received at the light-emitting control line EL, so as to control the light-emitting device 109 to emit light.

In some examples, the second reset sub-circuit 108 and the second light-emitting control sub-circuit 107 are both coupled to an anode of the light-emitting device 109, and a cathode of the light-emitting device 109 is electrically connected to a second voltage signal line VSS. For example, the light-emitting device 109 is a light-emitting diode.

Hereinafter, a node where the light-emitting device 109 is electrically connected to the second reset sub-circuit 108 and the second light-emitting control sub-circuit 107 is referred to as a fourth node N4.

For example, the second reset sub-circuit 108 includes a fifth transistor T5. A control electrode of the fifth transistor T5 is electrically connected to the second reset signal line Reset2, a first electrode of the fifth transistor T5 is electrically connected to the initialization signal line VINT, and a second electrode of the fifth transistor T5 is electrically connected to the fourth node N4.

The second light-emitting control sub-circuit 107 includes a sixth transistor T6. A control electrode of the sixth transistor T6 is electrically connected to the light-emitting control line EL, a first electrode of the sixth transistor T6 is electrically connected to the second node N2, and a second electrode of the sixth transistor T6 is electrically connected to the fourth node N4.

In some embodiments, the gate scan line Gate and the second reset signal line Reset2 that are electrically connected to the pixel circuits 100 in a row of sub-pixels are a same gate control line GL. That is, the gate scan signal and the second reset signal are a same signal. In a case where the sub-pixels are arranged in an array of N rows and M columns, the first reset signal line Reset1 electrically connected to pixel circuits 100 in a row of sub-pixels is a gate scan line Gate electrically connected to a previous row of sub-pixels.

In some embodiments, on/off types of the transistors included in the above sub-circuits are all the same. For example, the first transistor T1 to the sixth transistor T6, and the driving transistor Td are all P-type transistors or are all N-type transistors. For example, the above transistors are all low temperature poly-silicon thin film transistors. The embodiments of the present disclosure are described by taking an example in which the above transistors are all P-type transistors.

Figure 4:
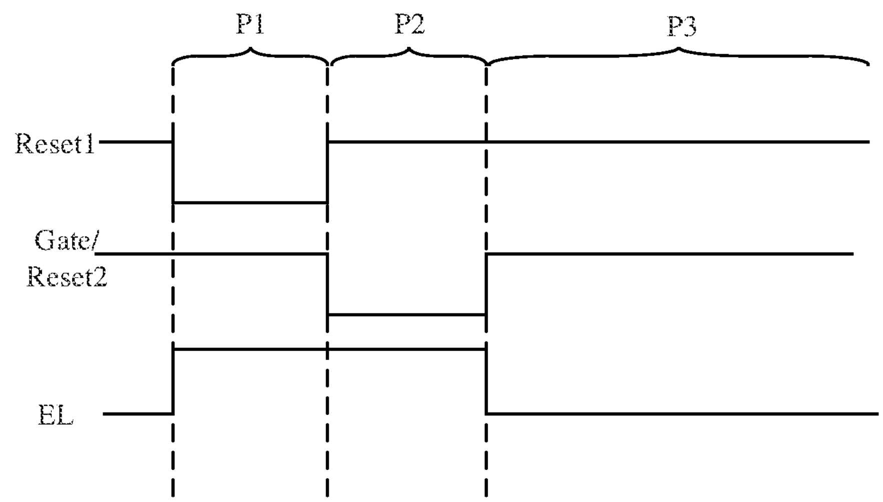
FIG. 4 is a timing diagram of a pixel circuit, in accordance with some embodiments.

Referring to FIG. 4, the driving process of the pixel circuit 100 in a frame period includes a reset phase P1, an input and compensation phase P2, and a light-emitting phase P3.

In the reset phase P1:

the first reset sub-circuit 103 transmits an initialization signal received at the initialization signal line VINT to the first node N1 in response to a first reset signal received at the first reset signal line Reset1, so as to reset the first node N1.

Both the storage sub-circuit 101 and the driving sub-circuit 102 are electrically connected to the first node N1, so that the storage sub-circuit 101 and the driving sub-circuit 102 are reset in the reset phase P1.

For example, as shown in FIGS. 3A and 3B, in a case where any sub-circuit in the pixel circuit 100 includes a transistor or a capacitor, the reset phase P1 includes following contents.

"A case where the any sub-circuit in the pixel circuit 100 includes a transistor or a capacitor" herein is a case where the storage sub-circuit 101 includes the storage capacitor Cst, the driving sub-circuit 102 includes the driving transistor Td, the first reset sub-circuit 103 includes the first transistor T1, the compensation sub-circuit 104 includes the second transistor T2, the data writing sub-circuit 105 includes the third transistor T3, the first light-emitting control sub-circuit 106 includes the fourth transistor T4, the second reset sub-circuit 108 includes the fifth transistor T5, and the second light-emitting control sub-circuit 107 includes the sixth transistor T6. In the following, "0" represents that a level of a certain signal is a low level, and "1" represents that a level of a certain signal is a high level.

In the reset phase P1, the first reset signal is 0, the gate scan signal (second reset signal) is 1, and the light-emitting control signal is 1.

The first transistor T1 is turned on under control of the first reset signal to transmit the initialization signal to the first node N1. The second transistor T2 to the sixth transistor T6 and the driving transistor Td are all turned off.

In some examples, in a case where the first transistor T1 is a dual-gate transistor, and the first transistor T1 includes the first sub-transistor T11 and the second sub-transistor T12, that the first transistor T1 is turned on under the control of the first reset signal means that both the first sub-transistor T11 and the second sub-transistor T12 are turned on under the control of the first reset signal, so as to transmit the initialization signal.

In the input and compensation phase P2:

the second reset sub-circuit 108 transmits an initialization signal received at the initialization signal line VINT to the fourth node N4 in response to a second reset signal received at the second reset signal line Reset2, so as to reset the light-emitting device 109;

the data writing sub-circuit 105 transmits a data signal received at the data line DL to the third node N3 in response to a gate scan signal received at the gate scan line Gate;

the driving sub-circuit 102 transmits the data signal at the third node N3 to the second node N2 due to voltages of the first node N1 and the third node N3;

the compensation sub-circuit 104 transmits the data signal at the second node N2 to the first node N1 in response to the gate scan signal received at the gate scan line Gate, so as to perform threshold compensation on the driving sub-circuit 102;

the storage sub-circuit 101 receives and stores a voltage of the first node N1.

For example, as shown in FIGS. 3A and 3B, in the case where any sub-circuit in the pixel circuit 100 includes a transistor or a capacitor, the input and compensation phase P2 includes following contents.

In the input and compensation phase P2, the first reset signal is 1, the gate scan signal (second reset signal) is 0, and the light-emitting control signal is 1.

The fifth transistor T5 is turned on under control of the second reset signal to transmit the initialization signal to the fourth node N4, so as to reset the anode of the light-emitting device 109.

The third transistor T3 is turned on under control of the gate scan signal to transmit the data signal to the third node N3.

A potential of the control electrode (gate) of the driving transistor Td is a potential of the first node N1, i.e., a potential of the initialization signal. A potential of the first electrode (source) of the driving transistor Td is a potential of the third node N3, i.e., a potential $V_{data}$ of the data signal. A gate-source voltage of the driving transistor Td is less than a threshold voltage $V_{th}$ thereof, so that the driving transistor Td is turned on to transmit the data signal from the third node N3 to the second node N2.

The second transistor T2 is turned on under the control of the gate scan signal to transmit the data signal at the second node N2 to the first node N1, thereby writing the data signal into the storage capacitor Cst. The storage capacitor Cst maintains the potential of the first node N1. In a case where the second transistor T2 is a dual-gate transistor, and the second transistor T2 includes the third sub-transistor T21 and the fourth sub-transistor T22, that the second transistor T2 is turned on under the control of the gate scan signal means that the third sub-transistor T21 and the fourth sub-transistor T22 are both turned on under the control of the gate scan signal.

The potential of the first node N1 gradually increases from a potential $V_{int}$ of the initialization signal. When the potential of the first node N1 increases to a sum of $V_{data}$ and $V_{th}$ (i.e., $V_{data}+V_{th}$), the driving transistor Td is turned off, and the input and compensation phase P2 ends, thereby writing the voltage of the data signal and the threshold voltage into the storage capacitor Cst.

In the light-emitting phase P3:

the first light-emitting control sub-circuit 106 transmits a first voltage signal received at the first voltage signal line VDD to the third node N3 in response to a light-emitting control signal received at the light-emitting control line EL;

the driving sub-circuit 102 generates a driving current under control of the voltages of the first node N1 and the third node N3, and outputs the driving current to the second node N2;

the second light-emitting control sub-circuit 107 transmits the driving current at the second node N2 to the fourth node N4 (i.e., the anode of the light emitting device 109) in response to the light-emitting control signal received at the light-emitting signal line EL, so that the light-emitting device 109 emits light under control of the driving current.

The first transistor T1, the second transistor T2, the third transistor T3 and the fifth transistor T5 are turned off.

For example, as shown in FIGS. 3A and 3B, in a case where any sub-circuit in the pixel circuit 100 includes a transistor or a capacitor, the light-emitting phase P3 includes following contents.

In the light-emitting phase P3, the first reset signal is 1, the gate scan signal (the second reset signal) is 1, and the light-emitting control signal is 0.

The fourth transistor T4 transmits the first voltage signal to the third node N3 under control of the light-emitting control signal.

The potential of the third node N3 is a voltage $V_{dd}$ of the first voltage signal, and the potential of the first node N1 is a sum of $V_{data}$ and $V_{th}$ (i.e., $V_{data}+V_{th}$). The driving transistor Td generates the driving current under the control of the voltages of the first node N1 and the third node N3, and the driving transistor Td works in a saturation region. According to a saturation current formula, the driving current (the current transmitted to the light-emitting device 109) generated by the driving transistor Td is:

$$
\begin{aligned}
I_{oled} &= \frac{W}{2L} \times \mu \times C_{OX}(V_{gs} - V_{th})^2 \\
&= \frac{W}{2L} \times \mu \times C_{OX}(V_{data} + V_{th} - V_{dd} - V_{th})^2 . \\
&= \frac{W}{2L} \times \mu \times C_{OX}(V_{data} - V_{dd})^2
\end{aligned}
$$

Where W/L is a width-to-length ratio of a channel of the driving transistor Td; μ is a carrier mobility; $C_{ox}$ is a channel capacitance per unit area of the driving transistor Td; $V_{gs}$ is the gate-source voltage of the driving transistor Td; $V_{th}$ is the threshold voltage of the driving transistor Td, $V_{dd}$ is a voltage of the first voltage signal.

It can be seen that, a magnitude of the current $I_{oled}$ transmitted to the light-emitting device 109 is related to the voltage $V_{data}$ of the written data signal and the first voltage signal, and is not related to the threshold voltage $V_{th}$ of the driving transistor Td. In this way, a problem that a difference of threshold voltages of driving transistors Td of the pixel circuits 100 caused by a manufacturing process affects magnitude of driving currents and thus the display effect is influenced may be avoided.

During an entire light-emitting phase P3 of a frame period, in the light-emitting process of the light-emitting device 109, a driving signal generated by the driving transistor Td in the driving sub-circuit 102 is the driving current. As can be seen from the calculation formula of the driving current, for the driving transistor Td, the driving signal generated by the driving transistor Td is related to a difference between the gate-source voltage of the driving transistor Td, which is related to a potential of the control electrode (gate) thereof, and the threshold voltage of the driving transistor Td (i.e., $V_{gs}-V_{th}$). Stability of the potential of the control electrode of the driving transistor Td (i.e., the potential of the first node N1) may affect stability and an effective value of the generated driving signal, thereby affecting stability and continuity of light emission of the light-emitting device 109.

In the light-emitting phase P3, in an ideal case, the first transistor T1, the second transistor T2 and the third transistor T3 are all in an off state and no current flows through them, so that the potential of the first node N1 may be maintained. However, in an actual situation, the switching transistor has a leakage current in the off state, and the leakage current of the switching transistor is large due to an influence of process abnormity. As a result, potentials of the first node N1 and the third node N3 change in the light-emitting phase, and cannot be kept stable. Due to differences of the first transistors T1, the second transistors T2 and the third transistors T3 in different pixel circuits 100, potential changes of the first nodes N1 and the third nodes N3 in different pixel circuits 100 are different. Therefore, the gate-source voltages of the driving transistors Td are different significantly, and the currents generated by the driving transistors Td are different, which cannot drive the light-emitting devices 109 to emit light stably. As a result, the pixels become brighter or darker, which results in a phenomenon of poor bright and dark spots.

In the pixel circuit 100 provided by some embodiments of the present disclosure, transistors electrically connected to the control electrode of the driving transistor Td (the first node N1) is referred to as first switching transistors, and transistors electrically connected to the first electrode or the second electrode of the driving transistor Td are referred to as second switching transistors.

It is found through research that the leakage current of the switching transistor in the off state is also affected by a voltage difference between a source and a drain of the switching transistor in addition to the reasons described above. In a case where a source-drain voltage of the switching transistor becomes larger, the leakage becomes severer. In a case where voltages of the source and the drain of the switching transistor are substantially equal, there is almost no leakage current flowing through the switching transistor. Moreover, in a case where a potential of the first electrode of the switching transistor is greater than a potential of the second electrode of the switching transistor, the leakage current hardly flows from the second electrode to the first electrode of the switching transistor, and vice versa. Based on this, in some embodiments, patterns of active layers of the first switching transistors (i.e., the first transistor T1 and the second transistor T2) are redesigned such that portions of the active layers of the first switching transistors and the gate control line GL may be overlapped to form capacitors, so as to add voltage stabilizing sub-circuits in the pixel circuit 100. The voltage stabilizing sub-circuit may stabilize the voltages of the source and the drain of the first switching transistor and reduce the source-drain voltage, thereby reducing the leakage current of the first switching transistor in the light-emitting phase, and stabilizing the potential of the first node N1.

The following first introduces structures of film layers included in the display panel 01.

Figure 5:
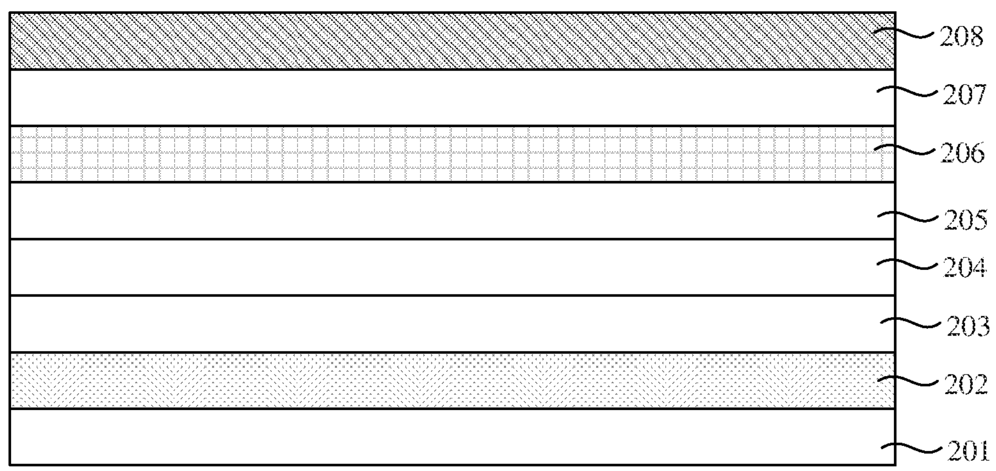
FIG. 5 is a diagram showing a film structure of a display panel, in accordance with some embodiments.
Figure 6:
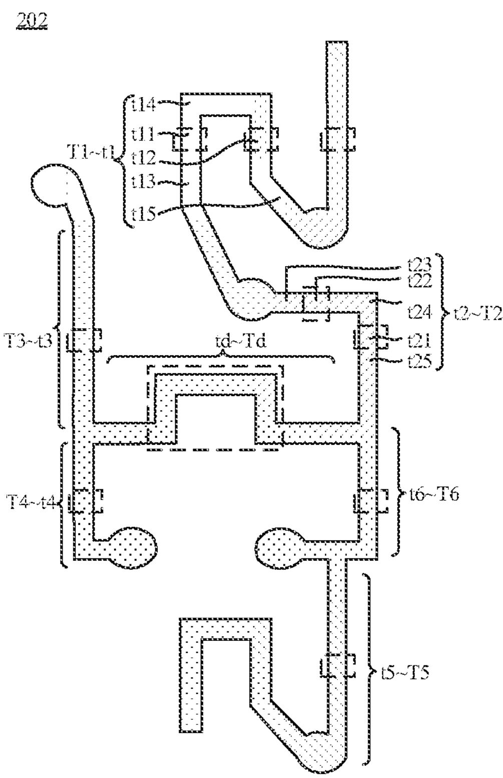
FIG. 6 is a diagram showing a structure of a semiconductor layer, in accordance with some embodiments.
Figure 7:
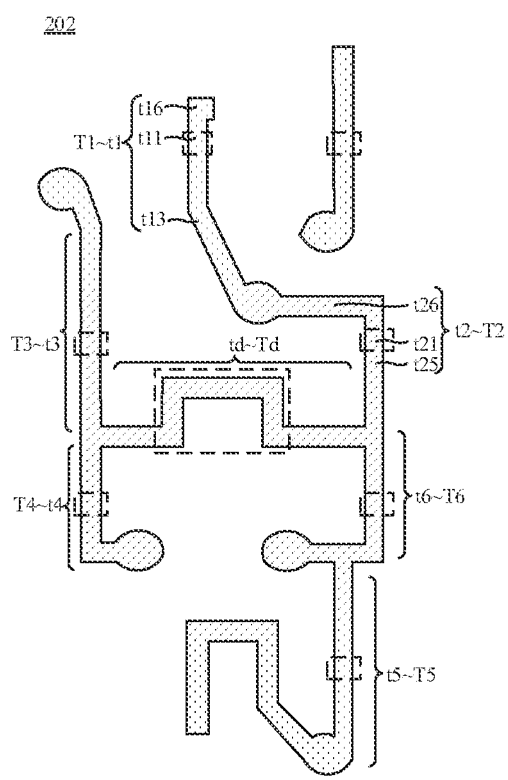
FIG. 7 is a diagram showing a structure of another semiconductor layer, in accordance with some embodiments.
Figure 11:
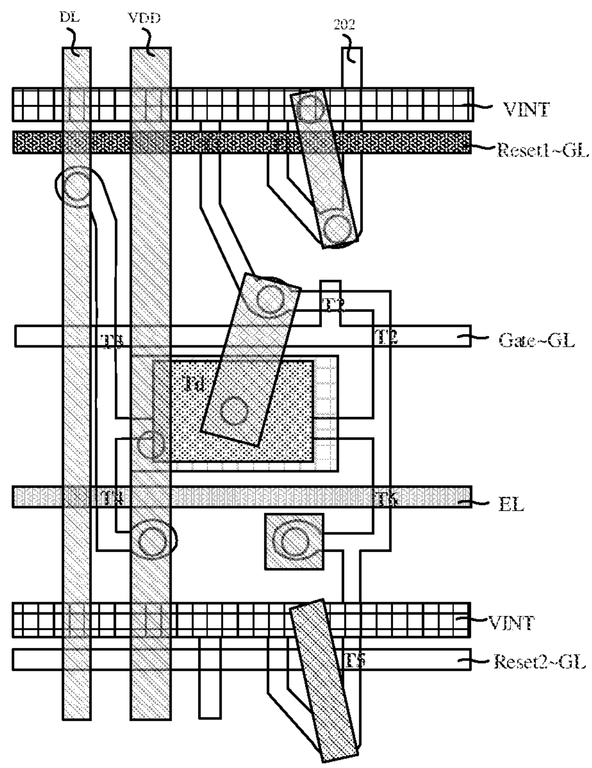
FIG. 11 is an overall layout of a pixel circuit, in accordance with some embodiments.
Figure 12:
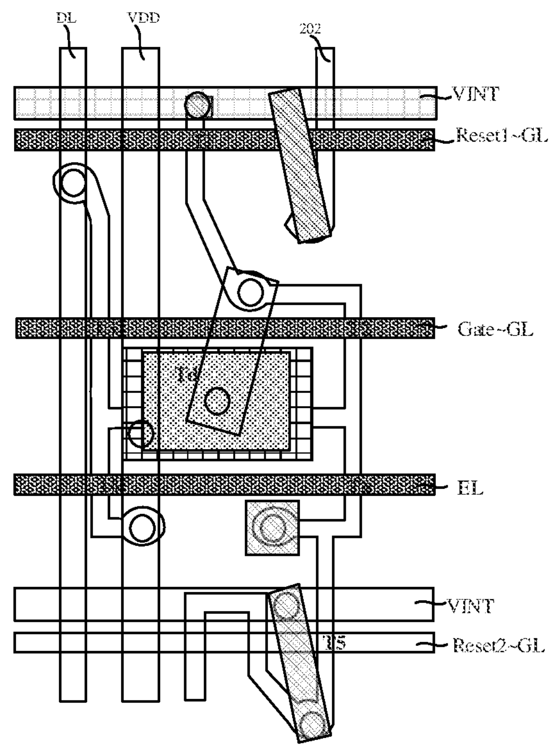
FIG. 12 is an overall layout of another pixel circuit, in accordance with some embodiments.

In some embodiments, as shown in FIG. 5, the display panel 01 has the following structure. The display panel 01 includes the base 201, a semiconductor layer 202, a first gate insulating layer 203, a first gate layer 204, a second gate insulating layer 205, a second gate layer 206, an interlayer insulating layer 207 and a source-drain metal layer 208. FIGS. 6 to 10 show semiconductor layers 202, the first gate layer 204, the second gate layer 206 and the source-drain metal layer 208 that correspond to the pixel circuits 100 shown in FIG. 3A and FIG. 3B. FIGS. 11 and 12 are overall layouts of film layers in the pixel circuit 100 (the first gate insulating layer 203, the second gate insulating layer 205 and the interlayer insulating layer 207 are in transparent colors). FIG. 6 is a diagram showing a structure of a semiconductor layer 202 corresponding to the pixel circuit 100 shown in FIG. 3B, and FIG. 7 is a diagram showing a structure of a semiconductor layer 202 corresponding to the pixel circuit 100 shown in FIG. 3A.

In some examples, the semiconductor layer 202 is disposed on the base 201 and has a set pattern. The semiconductor layer 202 includes active layers, which includes active layer bodies, of the transistors in the pixel circuits 100. As shown in FIGS. 6 and 7, in a sub-pixel region, the semiconductor layer 202 includes an active layer body td of the driving transistor Td, an active layer body t1 of the first transistor T1, an active layer body t2 of the second transistor T2, an active layer body t3 of the third transistor T3, an active layer body t4 of the fourth transistor T4, an active layer body t5 of the fifth transistor T5 and an active layer body t6 of the sixth transistor T6. An active layer body of each transistor may include at least one channel portion and at least one conductive portion, and the conductive portion is a source portion or a drain portion. An active portion of a transistor is a portion of the active layer body that overlaps with a corresponding gate control line GL. For example, the portions in the dashed boxes in FIGS. 6 and 7 are active portions of the transistors. For example, the active layers of the transistors are integrally provided.

For example, the semiconductor layer 202 may be made of amorphous silicon, polysilicon, oxide semiconductor material, or the like. It will be noted that the source portion and the drain portion may be portions doped with n-type impurities or p-type impurities. The semiconductor layer 202 is formed, for example, by depositing a semiconductor material on a surface of the base 201, and performing an etching process, so that the semiconductor layer 202 having the set pattern is formed.

As shown in FIG. 5, the first gate insulating layer 203 is disposed on a side of the semiconductor layer 202 away from the base 201. The first gate layer 204 is disposed on a side of the first gate insulating layer 203 away from the base 201. The first gate insulating layer 203 is configured to isolate the semiconductor layer 202 and the first gate layer 204 from each other and protect the semiconductor layer 202.

Figure 8:
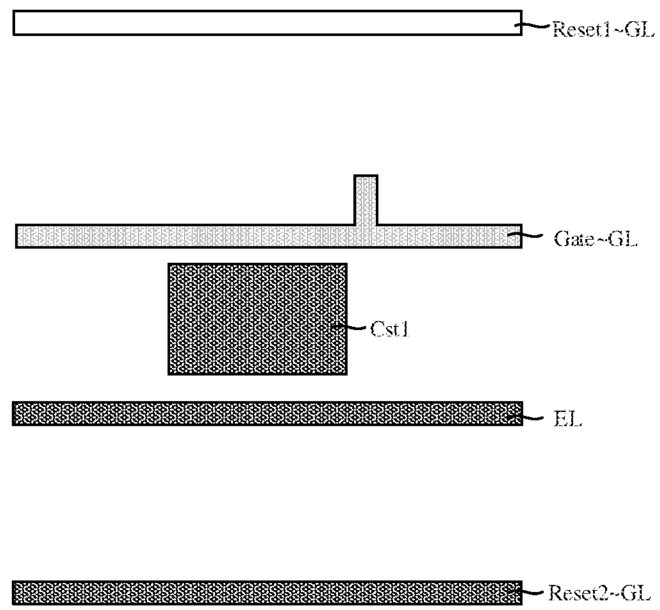
FIG. 8 is a diagram showing a structure of a first gate layer, in accordance with some embodiments.

In some examples, as shown in FIG. 8, the first gate layer 204 includes a plurality of gate control lines GL, a plurality of light-emitting control lines EL, and first electrode plates Cst1 of a plurality of storage capacitors Cst. In a sub-pixel, the first gate layer 204 includes a first reset signal line Reset1, a second reset signal line Reset2, a gate scan line Gate and a light-emitting control line EL. For example, a portion of a signal line in the first gate layer 204 that overlaps with an active layer body of a transistor in the semiconductor layer 202 serves as a gate of the transistor, and a portion of the active layer body of the transistor that is directly opposite to the gate is a channel portion thereof.

For example, as shown in FIG. 11, an active layer body of a first transistor T1 overlaps with a first reset signal line Reset1 at two positions, and gates of the first transistor T1 are portions of the first reset signal line Reset1 that overlap with the active layer body of the first transistor T1, and the active layer body of the first transistor T1 includes two channel portions. It can be understood that the first transistor T1 is a dual-gate transistor. Alternatively, as shown in FIG. 12, an active layer body of a first transistor T1 overlaps with a first reset signal line Reset1 at one position, and a gate of the first transistor T1 is a portion of the first reset signal line Reset1 that overlaps with the active layer body of the first transistor T1, and the active layer body of the first transistor T1 includes one channel portion. It can be understood that the first transistor T1 is a single-gate transistor.

For example, as shown in FIG. 11, an active layer body of a second transistor T2 overlaps with a gate scan line Gate at two positions, and gates of the second transistor T2 are portions of the gate scan line Gate that overlap with the active layer body of the second transistor T2, and the active layer body of the second transistor T2 includes two channel portions. It can be understood that the second transistor T2 is a dual-gate transistor. Alternatively, as shown in FIG. 12, an active layer body of a second transistor T2 overlaps with a gate scan line Gate at one position, and a gate of the second transistor T2 is a portion of the gate scan line Gate that overlaps with the active layer body of the second transistor T2, and the active layer body of the second transistor T2 includes one channel portion. It can be understood that the second transistor T2 is a single-gate transistor.

The above is only an example of the active layer bodies and the gates of the first transistor T1 and the second transistor T2. For gates of other transistors and channel portions of the active layer bodies of other transistors, reference may be made to the drawings and the above description of the first transistor T1 and the second transistor T2, which will not be repeated herein.

It will be noted that the dashed rectangular boxes in FIGS. 6 and 7 show portions of the active layers of the transistors in the pixel circuit 100 overlapped with the first gate layer 204.

As shown in FIG. 5, the second gate insulating layer 205 is disposed on a side of the first gate layer 204 away from the base 201. The second gate layer 206 is disposed on a side of the second gate insulating layer 205 away from the base 201. The second gate insulating layer 205 is configured to isolate the first gate layer 204 and the second gate layer 206 from each other and protect the first gate layer 204.

Figure 9:
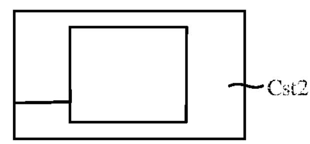
FIG. 9 is a diagram showing a structure of a second gate layer, in accordance with some embodiments.
Figure 9:
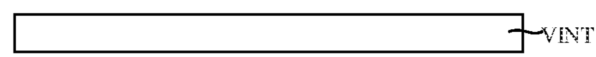

In some examples, as shown in FIG. 9, the second gate layer 206 includes a plurality of initialization signal lines VINT and second electrode plates Cst2 of the plurality of storage capacitors Cst. Each initialization signal line VINT is electrically connected to conductive portion(s) of a first transistor T1 through via hole(s). An orthogonal projection of a first electrode plate of a storage capacitor Cst on the base 201 and an orthogonal projection of a second electrode plate of the storage capacitor Cst on the base 201 have an overlapping portion, and a portion of the first electrode plate and a portion of the second electrode plate that overlap constitute the storage capacitor Cst.

As shown in FIG. 5, the interlayer insulating layer 207 is disposed on a side of the second gate layer 206 away from the base 201. The source-drain metal layer 208 is disposed on a side of the interlayer insulating layer 207 away from the base 201. The interlayer insulating layer 207 is configured to isolate the second gate layer 206 and the source-drain metal layer 208 from each other and protect the second gate layer 206.

Figure 10:
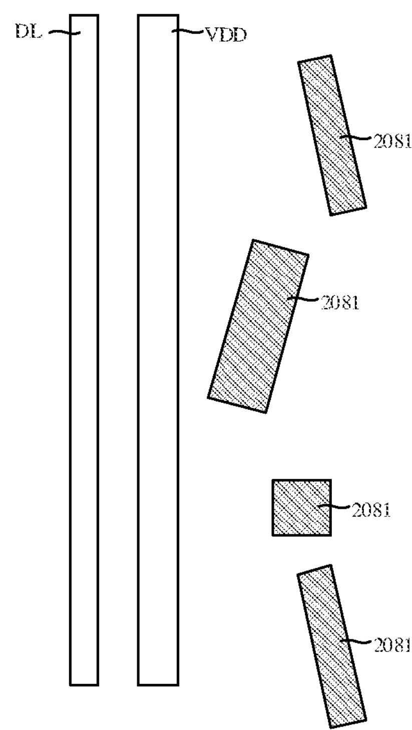
FIG. 10 is a diagram showing a structure of a source-drain metal layer, in accordance with some embodiments.

In some examples, as shown in FIG. 10, the source-drain metal layer 208 includes a plurality of first voltage signal lines VDD, a plurality of data lines DL and at least one connection portion 2081. A first voltage signal line VDD is electrically connected to a second electrode plate of a storage capacitor Cst through a via hole, and a data line DL is electrically connected to a conductive portion of a third transistor T3 through a via hole. The connection portion 2081 is configured to electrically connect a transistor with a signal line, or electrically connect a transistor with another transistor.

In order to solve the problem of the leakage currents of the first switching transistors in the pixel circuit 100 during the light-emitting phase, in some embodiments, active layers of the first switching transistors have redesigned patterns, and the patterns of the active layers of the first switching transistors are described below. For the first gate insulating layer 203, the first gate layer 204, the second gate insulating layer 205, the second gate layer 206, the interlayer insulating layer 207 and the source-drain metal layer 208 included in the display panel 01, reference may be made to the above description. It will be noted that, the following first switching transistors refer to first transistors T1 and second transistors T2.

Figure 13:
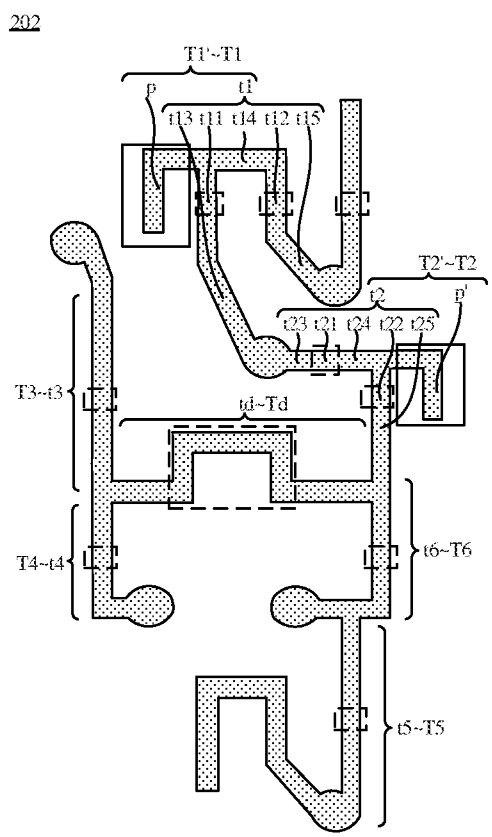
FIG. 13 is a diagram showing a structure of yet another semiconductor layer, in accordance with some embodiments.

As shown in FIG. 13, in some embodiments, the first switching transistor includes an active layer. The active layer includes an active layer body and at least one extension portion, and the active layer body includes at least one channel portion and at least one conductive portion. An extension portion is electrically connected to a conductive portion of the active layer body. For example, referring to FIG. 13, the first switching transistor is a first transistor T1. The first transistor T1 includes an active layer T1'. The active layer T1' includes an active layer body t1 and at least one extension portion p. The active layer body t1 includes at least one channel portion and at least one conductive portion. Alternatively, the first switching transistor is a second transistor T2. The second transistor T2 includes an active layer T2'. The active layer T2' includes an active layer body t2 and at least one extension portion p'. The active layer body t2 includes at least one channel portion and at least one conductive portion. In the active layer bodies, portions in the dashed boxes are channel portions, and other portions are conductive portions.

Figure 14:
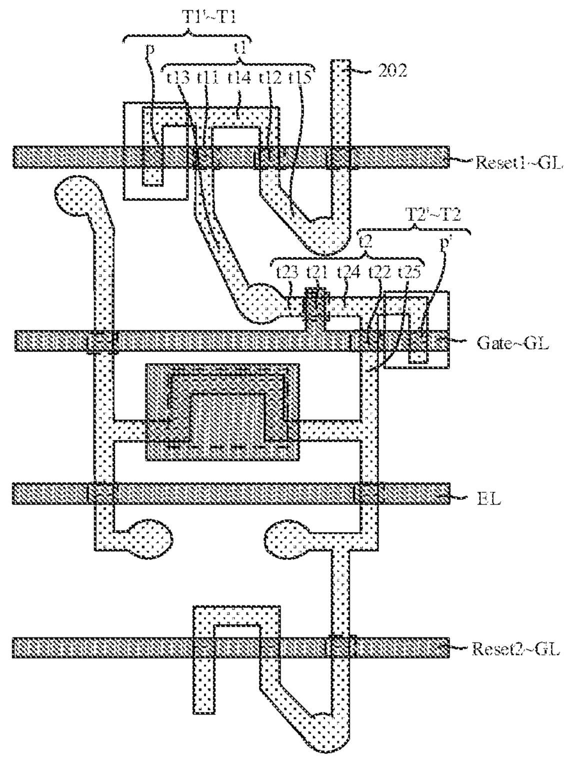
FIG. 14 is a diagram showing structures of a semiconductor layer and a first gate layer, in accordance with some embodiments.

As shown in FIG. 14, at least a portion of an orthogonal projection of each extension portion on the base 201 is overlapped with an orthogonal projection of a gate control line GL on the base 201, and a portion of the extension portion and a portion of the gate control line GL that overlap constitute a voltage stabilizing capacitor. For example, at least a portion of an orthogonal projection of the extension portion p of the first transistor T1 on the base 201 is overlapped with an orthogonal projection of a first reset signal line Reset1 on the base 201, and a portion of the extension portion p and a portion of the first reset signal line Reset1 that overlap constitute a voltage stabilizing capacitor. That is, the active layer of the first switching transistor further includes at least one extension portion electrically connected to the conductive portion(s) of the active layer body in addition to the active layer body. A positional relationship between the extension portion and the gate control line GL is that at least a portion of the orthogonal projection of the extension portion on the base 201 is overlapped with the orthogonal projection of the gate control line GL on the base 201.

In the display panel 01 provided by some embodiments of the present disclosure, the semiconductor layer 202 has a specially designed pattern. That is, the pattern of the active layer of the first switching transistor in each pixel circuit 100 is redesigned, so that the active layer includes an active layer body and at least one extension portion, and the at least one extension portion is electrically connected to conductive portion(s) of the active layer body. At least a portion of an orthogonal projection of the extension portion on the base 201 is overlapped with an orthogonal projection of a gate control line GL on the base 201, and a portion of the extension portion and a portion of the gate control line GL that overlap constitute a voltage stabilizing capacitor. It is equivalent to connecting the first switching transistor in parallel with the voltage stabilizing capacitor. According to characteristics of the capacitor, the capacitor has an ability to store charges and may keep a voltage across the capacitor stable. Therefore, voltages of the source and the drain of the first switching transistor may be substantially unchanged by providing the voltage stabilizing capacitor. In this way, the leakage current of the first switching transistor may be reduced, and the stability of the potential of the control electrode of the driving transistor Td (i.e., the potential of the first node N1) may be improved, thereby improving the stability of the driving signal generated by the driving transistor Td. As a result, the stability and the continuity of light emission of the light-emitting device 109 may be improved, and poor bright and dark spots of the display image caused by the leakage current of the first switching transistor may be improved.

In addition, the semiconductor layer 202 in the display panel 01 may be formed by first depositing a semiconductor material and then forming a pattern through an etching process, so that the semiconductor layer 202 is obtained. The other layers are not changed, and there is no need to add additional masks. Therefore, the display panel 01 may improve the poor bright and dark spots of the display image caused by the leakage current of the first switching transistor without increasing difficulty of the manufacturing process.

As shown in FIGS. 27, 29, 31 and 32, corresponding to the above pattern design of the active layers of the first switching transistors, the pixel circuit 100 provided by some embodiments of the present disclosure further includes a first voltage stabilizing sub-circuit 110 and a second voltage stabilizing sub-circuit 111, in addition to the storage sub-circuit 101, the driving sub-circuit 102, the first reset sub-circuit 103, the second reset sub-circuit 108, the compensation sub-circuit 104, the data writing sub-circuit 105, the first light-emitting control sub-circuit 106 and the second light-emitting control sub-circuit 107.

The first voltage stabilizing sub-circuit 110 is electrically connected to the first reset sub-circuit 103, and the first reset signal line Reset1 or the gate scan line Gate. The first voltage stabilizing sub-circuit 110 is configured to suppress a leakage current of the first reset sub-circuit 103. The second voltage stabilizing sub-circuit 111 is electrically connected to the compensation sub-circuit 104, and the first reset signal line Reset1 or the gate scan line Gate. The first voltage stabilizing sub-circuit 110 is configured to suppress a leakage current of the compensation sub-circuit 104.

In the pixel circuit 100, by providing the first voltage stabilizing sub-circuit 110 and the second voltage stabilizing sub-circuit 111, it is possible to suppress the leakage current of the first reset sub-circuit 103 and the leakage current of the compensation sub-circuit 104 during the light-emitting phase. In this way, the stability of the potential of the first node N1 may be improved, and further the stability of the driving signal generated by the driving sub-circuit 102 may be improved. Therefore, the stability and the continuity of light emission of the light-emitting device 109 may be improved, and the poor bright and dark spots of the display image caused by the leakage current of the first reset sub-circuit 103 and the leakage current of the compensation sub-circuit 104 may be improved.

In the following, the structure of the active layer of the first switching transistor will be described in a case where the first switching transistor is a dual-gate transistor or a single-gate transistor. The case where the first switching transistor is the dual-gate transistor will be described first.

In some embodiments, as shown in FIGS. 13 to 21, the active layer body (t1 or t2) of the first switching transistor (T1 or T2) includes two channel portions and three conductive portions. The conductive portions and the channel portions are electrically connected alternately in sequence, and one of the conductive portions is located between the two channel portions. The orthogonal projection of the gate control line GL on the base 201 is overlapped with orthogonal projections of the two channel portions of the first switching transistor on the base 201. That is, the first switching transistor is the dual-gate transistor.

The active layer (T1' or T2') of the first switching transistor (T1 or T2) includes at least one first extension portion (p1 or p1'). The first extension portion (p1 or p1') of the first switching transistor (T1 or T2) is electrically connected to the conductive portion located between the two channel portions of the first switching transistor (T1 or T2), and at least a portion of an orthogonal projection of the first extension portion (p1 or p1') of the first switching transistor (T1 or T2) on the base 201 is overlapped with the orthogonal projection of the gate control line GL on the base 201. A portion of the first extension portion and a portion of the gate control line GL that overlap constitute a voltage stabilizing capacitor (C1 or C5). The gate control line GL includes the first reset signal line Reset1 or the gate scan line Gate.

For example, the active layer of the first switching transistor includes one first extension portion, two first extension portions or three first extension portions, and portion(s) of the first extension portion(s) of the first switching transistor and portion(s) of the gate control line GL that overlap constitute one voltage stabilizing capacitor, two voltage stabilizing capacitors or three voltage stabilizing capacitors. In a case where the active layer of the first switching transistor includes a plurality of first extension portions, and the overlapping portions of the plurality of first extension portions of the first switching transistor and the gate control line GL constitute a plurality of voltage stabilizing capacitors, voltage stability of ends, electrically connected to the first switching transistor, of the plurality of voltage stabilizing capacitors may be enhanced, thereby further enhancing an improvement effect on the leakage current of the first switching transistor. The following embodiments of the present disclosure are described by taking an example in which the active layer of the first switching transistor includes one first extension portion.

As shown in FIGS. 15 to 18, in some examples, the three conductive portions of the first switching transistor (T1 or T2) are a first conductive portion (t13 or t23), a second conductive portion (t14 or t24) and a third conductive portion (t15 or t25), and the second conductive portion (t14 or t24) is located between the two channel portions of the first switching transistor (T1 or T2). One end of the first extension portion (p1 or p1') is electrically connected to the second conductive portion (t14 or t24), and the other end of the first extension portion extends in a direction away from the second conductive portion (t14 or t24). The first extension portion (p1 or p1') is located between the first conductive portion and the third conductive portion, or is located on a side of the active layer body of the first switching transistor.

Hereinafter, the active layer of the first switching transistor is described by taking an example in which the first switching transistor is the first transistor T1 or the second transistor T2.

Figure 15:
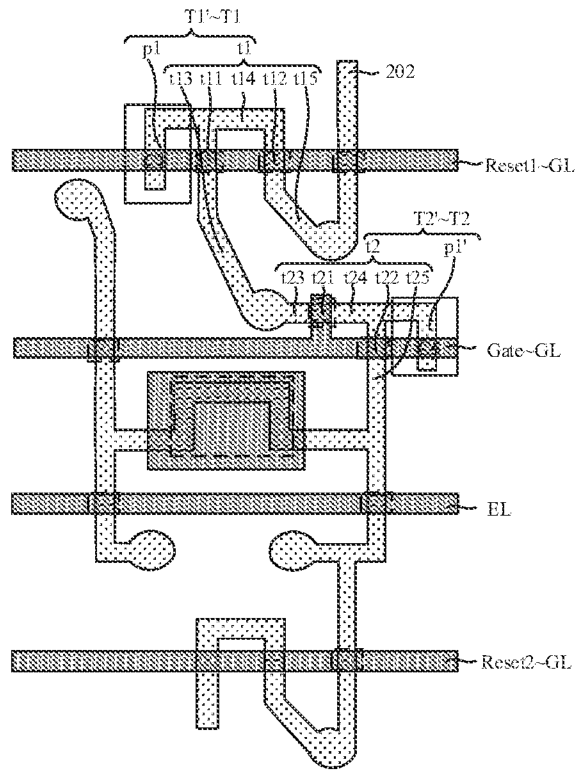
FIG. 15 is a diagram showing structures of another semiconductor layer and another first gate layer, in accordance with some embodiments.
Figure 16:
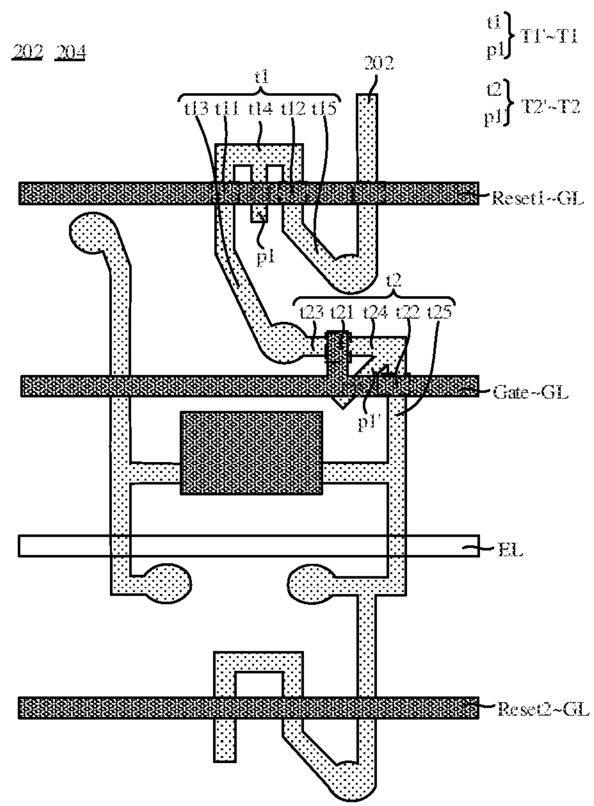
FIG. 16 is a diagram showing structures of yet another semiconductor layer and yet another first gate layer, in accordance with some embodiments.
Figure 17:
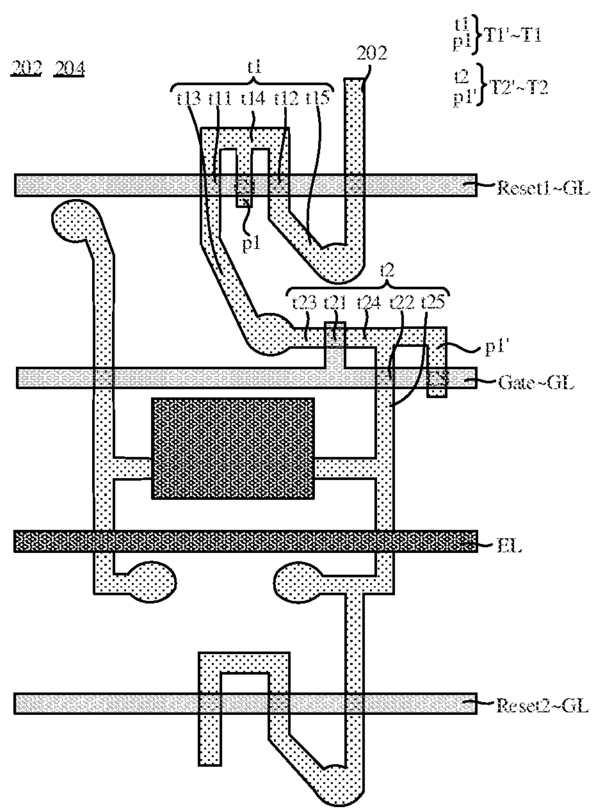
FIG. 17 is a diagram showing structures of yet another semiconductor layer and yet another first gate layer, in accordance with some embodiments.
Figure 18:
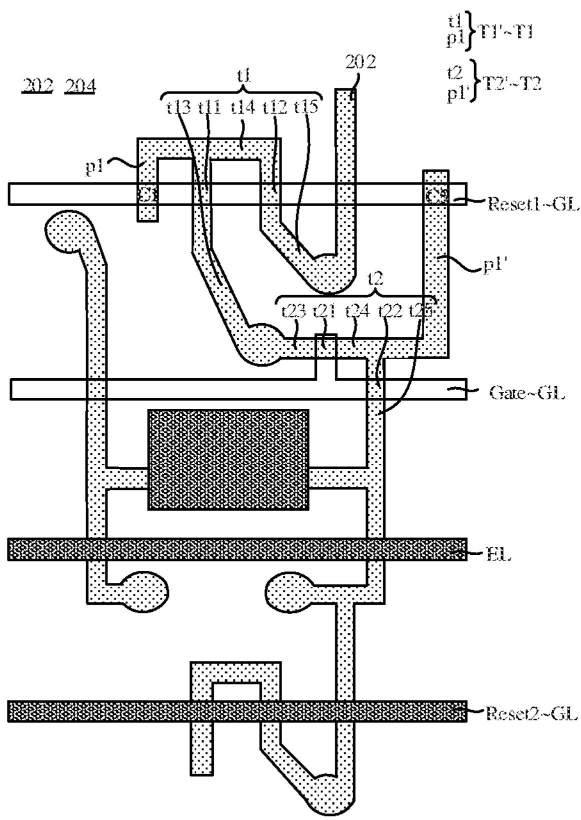
FIG. 18 is a diagram showing structures of yet another semiconductor layer and yet another first gate layer, in accordance with some embodiments.

For example, as shown in FIGS. 15 to 18, the first switching transistor is the first transistor T1, and the first transistor T1 is a dual-gate transistor. The active layer body t1 of the first transistor T1 is in a U shape. The active layer body t1 of the first transistor T1 includes a first channel portion t11, a second channel portion t12, a first conductive portion t13, a second conductive portion t14 and a third conductive portion t15. One end of the first extension portion p1 of the first transistor T1 is electrically connected to the second conductive portion t14, and the other end of the first extension portion p1 extends in a direction away from the second conductive portion t14. At least a portion of an orthogonal projection of the first extension portion p1 of the first transistor T1 on the base 201 is overlapped with an orthogonal projection of a first reset signal line Reset1 on the base 201, and a portion of the first extension portion p1 and a portion of the first reset signal line Reset1 that overlap constitute a first voltage stabilizing capacitor C1. As shown in FIGS. 16 and 17, the first extension portion p1 of the first transistor T1 is located between the first conductive portion t13 and the third conductive portion t15. Alternatively, as shown in FIGS. 15 and 18, the first extension portion p1 of the first transistor T1 is located on a side of the active layer body t1 of the first transistor T1. For example, the first extension portion p1 of the first transistor T1 is located on a side of the first conductive portion t13 away from the third conductive portion t15.

It will be noted that overlapping portions of the at least one first extension portion p1 of the first transistor T1 and the first reset signal line Reset1 constitute at least one first voltage stabilizing capacitor C1. That is, the number of first extension portions p1 of the first transistor T1 is the same as the number of first voltage stabilizing capacitors C1.

For example, as shown in FIGS. 15 to 18, the first switching transistor is the second transistor T2, and the second transistor T2 is a dual-gate transistor. The active layer body t2 of the second transistor T2 is in an L shape, and the active layer body t2 of the second transistor T2 includes a first channel portion t21, a second channel portion t22, a first conductive portion t23, a second conductive portion t24 and a third conductive portion t25. One end of the first extension portion p1' of the second transistor T2 is electrically connected to the second conductive portion t24, and the other end of the first extension portion p1' extends in a direction away from the second conductive portion t24. At least a portion of an orthogonal projection of the first extension portion p1' of the second transistor T2 on the base 201 is overlapped with an orthogonal projection of a first reset signal line Reset1 or a gate scan line Gate on the base 201, and overlapping portions of the first extension portion p1' and the first reset signal line Reset1 or the gate scan line Gate constitute a fifth voltage stabilizing capacitor C5.

As shown in FIG. 16, the first extension portion p1' of the second transistor T2 is located between the first conductive portion t23 and the third conductive portion t25, and at least a portion of the orthogonal projection of the first extension portion p1' of the second transistor T2 on the base 201 is overlapped with the orthogonal projection of the gate scan line Gate on the base 201. Alternatively, as shown in FIGS. 15, 17 and 18, the first extension portion p1' of the second transistor T2 is located on a side of the active layer body t2 of the second transistor T2. At least a portion of the orthogonal projection of the first extension portion p1' of the second transistor T2 on the base 201 is overlapped with the orthogonal projection of the first reset signal line Reset1 or the gate scan line Gate on the base 201. For example, as shown in FIGS. 15 and 17, the first extension portion p1' of the second transistor T2 is located on a side of the second conductive portion t24 away from the first conductive portion t23. At least a portion of the orthogonal projection of the first extension portion p1' of the second transistor T2 on the base 201 is overlapped with the orthogonal projection of the gate scan line Gate on the base 201. As shown in FIG. 18, the first extension portion p1' of the second transistor T2 is located on the side of the second conductive portion t24 away from the first conductive portion t23. At least a portion of the orthogonal projection of the first extension portion p1' of the second transistor T2 on the base 201 is overlapped with the orthogonal projection of the first reset signal line Reset1 on the base 201.

It will be noted that overlapping portions of the at least one first extension portion p1' of the second transistor T2 and the first reset signal line Reset1 or the gate scan line Gate constitute at least one fifth voltage stabilizing capacitor C5. That is, the number of first extension portions p1' of the second transistor T2 is the same as the number of fifth voltage stabilizing capacitors C5.

Figure 27:
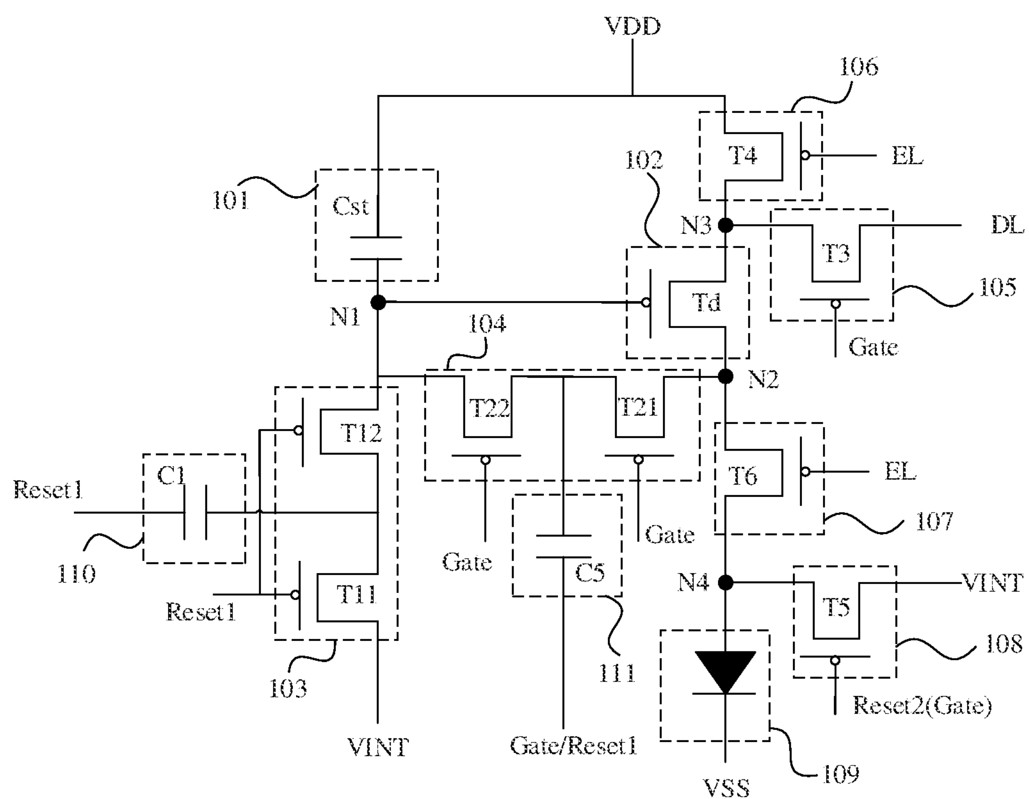
FIG. 27 is a diagram showing a structure of yet another sub-pixel, in accordance with some embodiments.

As shown in FIG. 27, corresponding to the above pattern design of the active layer of the first switching transistor (T1 or T2), in the pixel circuit 100 provided by some embodiments of the present disclosure, the first voltage stabilizing sub-circuit 110 includes at least one first voltage stabilizing capacitor C1, and the second voltage stabilizing sub-circuit 111 includes at least one fifth voltage stabilizing capacitor C5.

As shown in FIG. 27, in a case where the first reset sub-circuit 103 includes the first transistor T1 and the first transistor T1 is a dual-gate transistor, the first transistor T1 includes the first sub-transistor T11 and the second sub-transistor T12. The control electrode of the first sub-transistor T11 is electrically connected to the first reset signal line Reset1, the first electrode of the first sub-transistor T11 is electrically connected to the initialization signal line VINT, and the second electrode of the first sub-transistor T11 is electrically connected to the first electrode of the second sub-transistor T12. The control electrode of the second sub-transistor T12 is electrically connected to the first reset signal line Reset1, and the second electrode of the second sub-transistor T12 is electrically connected to the control electrode of the driving transistor Td. That is, the second electrode of the second sub-transistor T12 is electrically connected to the first node N1. A first end of the first voltage stabilizing capacitor C1 is electrically connected to the second electrode of the first sub-transistor T11. A second end of the first voltage stabilizing capacitor C1 is electrically connected to the first reset signal line Reset1.

In a case where the compensation sub-circuit 104 includes the second transistor T2 and the second transistor T2 is a dual-gate transistor, the second transistor T2 includes the third sub-transistor T21 and the fourth sub-transistor T22. The control electrode of the third sub-transistor T21 is electrically connected to the gate scan line Gate, the first electrode of the third sub-transistor T21 is electrically connected to the second electrode of the driving transistor Td, and the second electrode of the third sub-transistor T21 is electrically connected to the first electrode of the fourth sub-transistor T22. The control electrode of the fourth sub-transistor T22 is electrically connected to the gate scan line Gate, and the second electrode of the fourth sub-transistor T22 is electrically connected to the control electrode of the driving transistor Td. That is, the second electrode of the fourth sub-transistor T22 is electrically connected to the first node N1. A first end of the fifth voltage stabilizing capacitor C5 is electrically connected to the second electrode of the third sub-transistor T21. A second end of the fifth voltage stabilizing capacitor C5 is electrically connected to the first reset signal line Reset1 or the gate scan line Gate.

Hereinafter, operating processes of the second transistor T2 and the fifth voltage stabilizing capacitor C5 are taken as an example to describe a principle that the fifth voltage stabilizing capacitor C5 suppresses the leakage current of the second transistor T2. Since structures of the first transistor T1 and the first voltage stabilizing capacitor C1 are similar to structures of the second transistor T2 and the fifth voltage stabilizing capacitor C5, for the principle that the first voltage stabilizing capacitor C1 suppresses the leakage current of the first transistor T1, reference may be made to the following description, which will not be repeated herein.

Figure 28A:
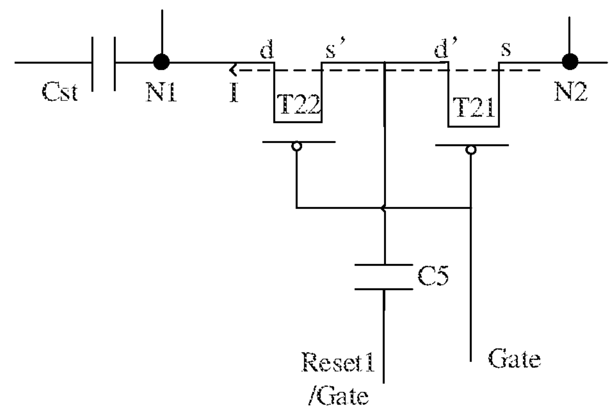
FIG. 28A is a schematic diagram of a second transistor in the pixel circuit in FIG. 27 in an on state.
Figure 28B:
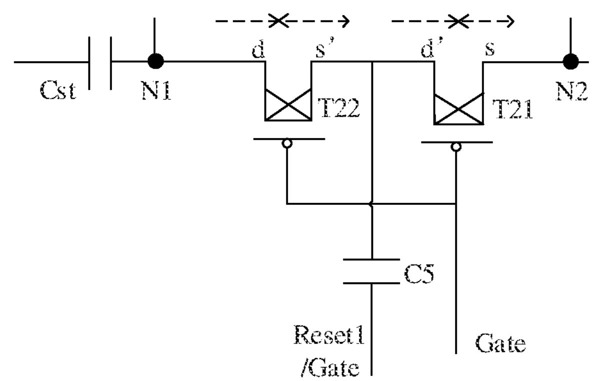
FIG. 28B is a schematic diagram of a second transistor in the pixel circuit in FIG. 27 in an off state.

As shown in FIGS. 28A and 28B, for convenience of description, an equivalent diagram of the fifth voltage stabilizing capacitor C5 and the second transistor T2 is simplified. The second transistor T2 includes the third sub-transistor T21 and the fourth sub-transistor T22. In the following description, a potential of the first electrode of the third sub-transistor T21 is $V_s$, a potential of the second electrode of the third sub-transistor T21 is $V_{d'}$, a potential of the first electrode of the fourth sub-transistor T22 is $V_{s'}$, a potential of the second electrode of the fourth sub-transistor T22 is $V_d$, and a potential of the first end of the fifth voltage stabilizing capacitor C5 is $V_{c5}$.

In the input and compensation phase P2, the third sub-transistor T21 and the fourth sub-transistor T22 are both turned on under the control of the gate scan signal to transmit an electrical signal I from the second node N2 to the first node N1. Upon the input and compensation phase P2 ends, the $V_s$ is greater than the $V_{d'}$, the $V_{d'}$ is equal to or approximately equal to the $V_{s'}$, the $V_{s'}$ is greater than the $V_d$, and the $V_{c5}$ is equal to or approximately equal to the $V_{s'}$. Due to a voltage holding function of the capacitor, the potential $V_{c5}$ of the first end of the fifth voltage stabilizing capacitor C5 remains stable. In the light-emitting phase P3, the third sub-transistor T21 and the fourth sub-transistor T22 are both turned off under the control of the gate scan signal. Since the potential $V_{c5}$ of the first end of the fifth voltage stabilizing capacitor C5 is maintained, the $V_{s'}$ and the $V_{d'}$ remain substantially unchanged and the $V_{s'}$ is still greater than the $V_d$. Thus, a current cannot flow from the second electrode of the fourth sub-transistor T22 to the first electrode thereof, so that a reverse leakage current of the first node N1 through the fourth sub-transistor T22 may be suppressed. Similarly, the $V_s$ is still greater than the $V_{d'}$. Thus, a current cannot flow from the second electrode of the third sub-transistor T21 to the first electrode thereof, so that a reverse leakage current of the third sub-transistor T21 may be suppressed. Therefore, leakage currents of the third sub-transistor T21 and the fourth sub-transistor T22 in the light-emitting phase P3 may be effectively reduced by providing the fifth voltage stabilizing capacitor C5, so that the voltage of the first node N1 may be maintained.

Figure 19:
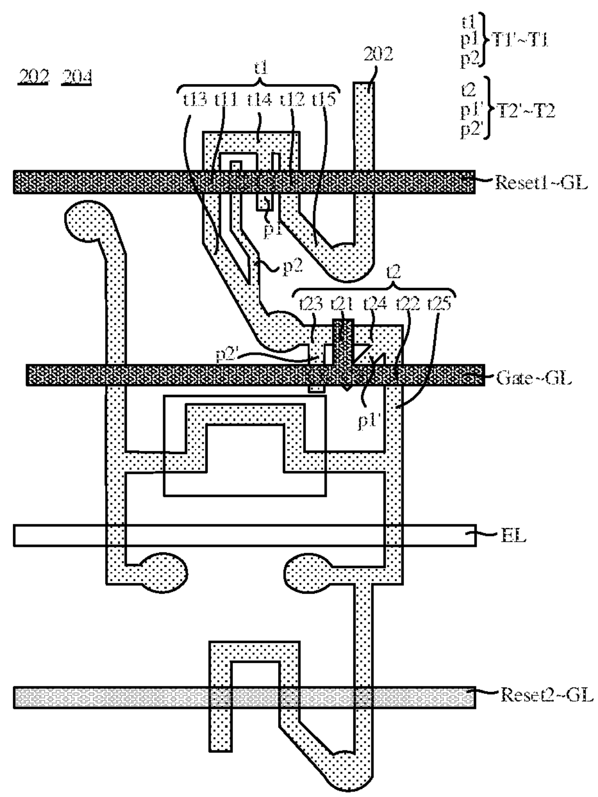
FIG. 19 is a diagram showing structures of yet another semiconductor layer and yet another first gate layer, in accordance with some embodiments.
Figure 20:
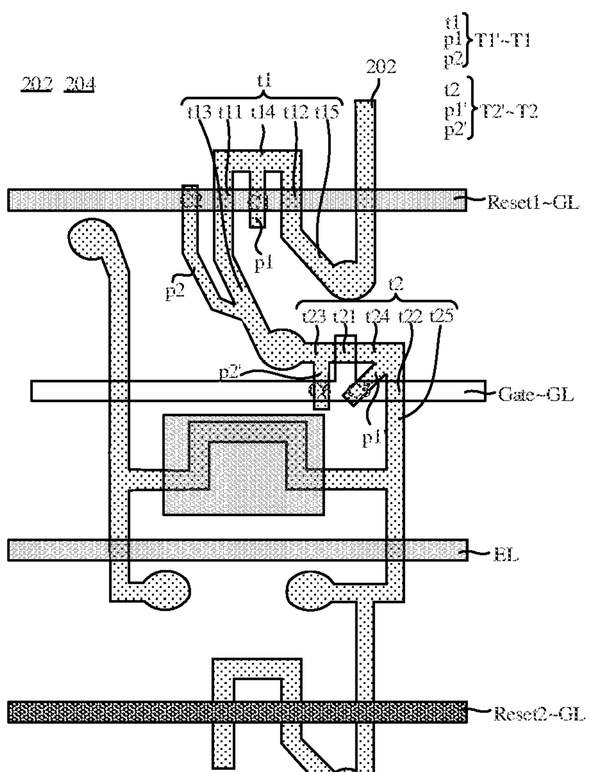
FIG. 20 is a diagram showing structures of yet another semiconductor layer and yet another first gate layer, in accordance with some embodiments.
Figure 21:
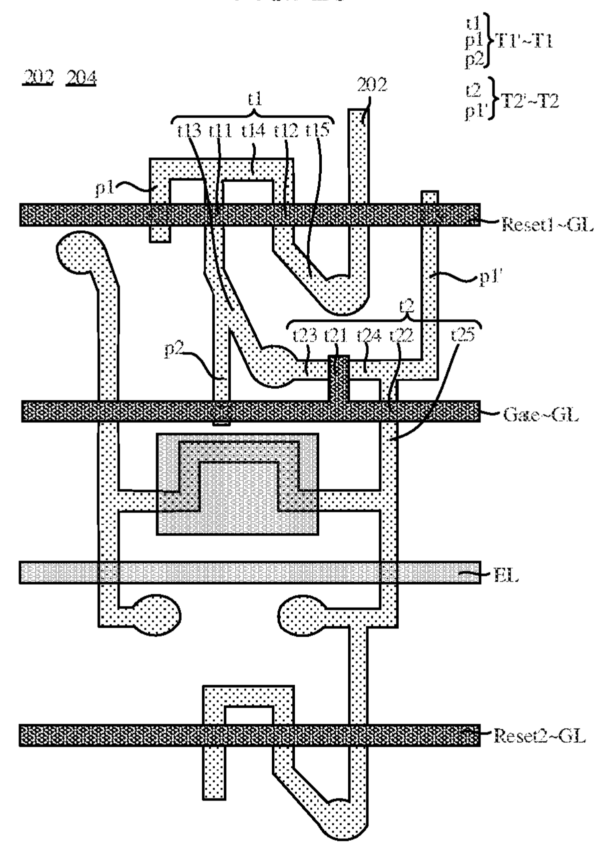
FIG. 21 is a diagram showing structures of yet another semiconductor layer and yet another first gate layer, in accordance with some embodiments.

In some embodiments, as shown in FIGS. 19 to 21, in a case where the first switching transistor is a dual-gate transistor, the active layer of the first switching transistor (T1 or T2) further includes at least one second extension portion (p2 or p2') in addition to the at least one first extension portion (p1 or p1'). One of two conductive portions, located at two ends, of the first switching transistor (T1 or T2) is electrically connected to the control electrode of the driving transistor Td. The second extension portion of the first switching transistor is electrically connected to the one conductive portion, which is electrically connected to the control electrode of the driving transistor Td, in the three conductive portions. At least a portion of an orthogonal projection of the second extension portion (p2 or p2') of the first switching transistor on the base 201 is overlapped with the orthogonal projection of the gate control line GL on the base 201, and overlapping portions of the second extension portion (p2 or p2') and the gate control line GL constitute a voltage stabilizing capacitor. The gate control line GL includes the first reset signal line Reset1 or the gate scan line Gate.

For example, the active layer of the first switching transistor includes one second extension portion, two second extension portions, or three second extension portions, and overlapping portions of the second extension portion(s) of the first switching transistor and the gate control line GL constitute one voltage stabilizing capacitor, two voltage stabilizing capacitors or three voltage stabilizing capacitors. In a case where the active layer of the first switching transistor includes a plurality of second extension portions, and the overlapping portions of the plurality of second extension portions of the first switching transistor and the gate control line GL constitute a plurality of voltage stabilizing capacitors, voltage stability of ends, electrically connected to the first switching transistor, of the plurality of voltage stabilizing capacitors may be enhanced, thereby further enhancing an improvement effect on the leakage current of the first switching transistor. The following embodiments of the present disclosure are described by taking an example in which the active layer of the first switching transistor includes one second extension portion.

As shown in FIGS. 19 to 21, in some examples, the three conductive portions of the first switching transistor (T1 or T2) are a first conductive portion (t13 or t23), a second conductive portion (t14 or t24) and a third conductive portion (t15 or t25), and the second conductive portion (t14 or t24) is located between the two channel portions of the first switching transistor (T1 or T2). The first conductive portion (t13 or t23) is electrically connected to the control electrode of the driving transistor Td. One end of the second extension portion (p2 or p2') is electrically connected to the first conductive portion (t13 or t23), and the other end of the second extension portion (p2 or p2') extends in a direction away from the first conductive portion (t13 or t23). The second extension portion is located between the first conductive portion and the third conductive portion, or on a side of the active layer body of the first switching transistor.

In the following, the active layer of the first switching transistor is described by taking an example in which the first switching transistor is the first transistor T1 or the second transistor T2.

For example, as shown in FIGS. 19 to 21, the first switching transistor is the first transistor T1, and the first transistor T1 is a dual-gate transistor. The active layer body t1 of the first transistor T1 is in the U shape. The active layer body t1 of the first transistor T1 includes the first channel portion t11, the second channel portion t12, the first conductive portion t13, the second conductive portion t14 and the third conductive portion t15. One end of the second extension portion p2 of the first transistor T1 is electrically connected to the first conductive portion t13, and the other end of the second extension portion p2 extends in the direction away from the first conductive portion t13. At least a portion of an orthogonal projection of the second extension portion p2 of the first transistor T1 on the base 201 is overlapped with the orthogonal projection of the first reset signal line Reset1 or the gate scan line Gate on the base 201, and overlapping portions of the second extension portion p2 and the first reset signal line Reset1 or the gate scan line Gate constitute a second voltage stabilizing capacitor C2.

As shown in FIG. 19, the second extension portion p2 of the first transistor T1 is located between the first conductive portion t13 and the third conductive portion t15, and at least a portion of the orthogonal projection of the second extension portion p2 of the first transistor T1 on the base 201 is overlapped with the orthogonal projection of the first reset signal line Reset1 on the base 201. Alternatively, as shown in FIGS. 20 and 21, the second extension portion p2 of the first transistor T1 is located on a side of the active layer body of the first transistor T1. For example, as shown in FIG. 20, the second extension portion p2 of the first transistor T1 is located on a side of the first conductive portion t13 away from the third conductive portion t15 and is proximate to the first reset signal line Reset1. At least a portion of the orthogonal projection of the second extension portion p2 of the first transistor T1 on the base 201 is overlapped with the orthogonal projection of the first reset signal line Reset1 on the base 201. For example, as shown in FIG. 21, the second extension portion p2 of the first transistor T1 is located on the side of the first conductive portion t13 away from the third conductive portion t15 and is proximate to the gate scan line Gate. At least a portion of the orthogonal projection of the second extension portion p2 of the first transistor T1 on the base 201 is overlapped with the orthogonal projection of the gate scan line Gate on the base 201.

It will be noted that overlapping portions of at least one second extension portion p2 of the first transistor T1 and the first reset signal line Reset1 or the gate scan line Gate constitute at least one second voltage stabilizing capacitor C2. That is, the number of second extension portions of the first transistor T1 is the same as the number of second voltage stabilizing capacitors C2.

For example, as shown in FIGS. 19 and 20, the first switching transistor is the second transistor T2, and the second transistor T2 is a dual-gate transistor. The active layer body of the second transistor T2 is in the L shape. The active layer body t2 of the second transistor T2 includes the first channel portion t21, the second channel portion t22, the first conductive portion t23, the second conductive portion t24 and the third conductive portion t25. One end of the second extension portion p2' of the second transistor T2 is electrically connected to the first conductive portion t23, and the other end of the second extension portion p2' extends in the direction away from the first conductive portion t23. At least a portion of an orthogonal projection of the second extension portion p2' of the second transistor T2 on the base 201 is overlapped with the orthogonal projection of the first reset signal line Reset1 or the gate scan line Gate on the base 201, and overlapping portions of the second extension portion p2' and the first reset signal line Reset1 or the gate scan line Gate constitute a sixth voltage stabilizing capacitor C6.

For example, as shown in FIGS. 19 and 20, the second extension portion p2' of the second transistor T2 is located on a side of the active layer body t2 of the second transistor T2. At least a portion of the orthogonal projection of the second extension portion p2' of the second transistor T2 on the base 201 is overlapped with the orthogonal projection of the gate scan line Gate on the base 201. Alternatively, at least a portion of the orthogonal projection of the second extension portion p2' of the second transistor T2 on the base 201 is overlapped with the orthogonal projection of the first reset signal line Reset1 on the base 201.

It will be noted that overlapping portions of the at least one second extension portion p2' of the second transistor T2 and the first reset signal line Reset1 or the gate scan line Gate constitute at least one sixth voltage stabilizing capacitor C6. That is, the number of the second extension portions p2' of the second transistor T2 is the same as the number of the sixth voltage stabilizing capacitors C6.

Figure 29:
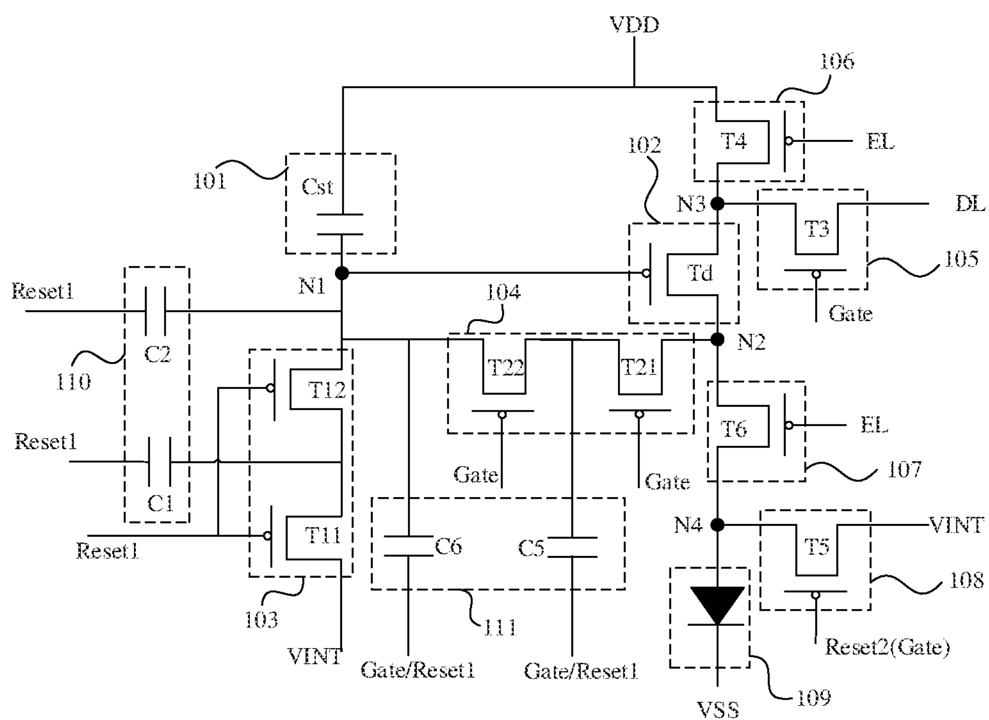
FIG. 29 is a diagram showing a structure of yet another sub-pixel, in accordance with some embodiments.

As shown in FIG. 29, corresponding to the above pattern design of the active layer of the first switching transistor (T1 or T2), in the pixel circuit 100 provided by some embodiments of the present disclosure, the first voltage stabilizing sub-circuit 110 further includes at least one second voltage stabilizing capacitor C2 on a basis of including at least one first voltage stabilizing capacitor C1, and the second voltage stabilizing sub-circuit 111 further includes at least one sixth voltage stabilizing capacitor C6 on a basis of including at least one fifth voltage stabilizing capacitor C5.

A first end of the second voltage stabilizing capacitor C2 is electrically connected to the second electrode of the second sub-transistor T12, and a second end of the second voltage stabilizing capacitor C2 is electrically connected to the first reset signal line Reset1 or the gate scan line Gate. The second electrode of the second sub-transistor T12 is electrically connected to the first node N1. That is, the first end of the second voltage stabilizing capacitor C2 is electrically connected to the first node N1.

A first end of the sixth voltage stabilizing capacitor C6 is electrically connected to the second electrode of the fourth sub-transistor T22, and a second end of the sixth voltage stabilizing capacitor C6 is electrically connected to the first reset signal line Reset1 or the gate scan line Gate. The second electrode of the fourth sub-transistor T22 is electrically connected to the first node N1. That is, the first end of the second voltage stabilizing capacitor C2 is electrically connected to the first node N1.

Figure 30A:
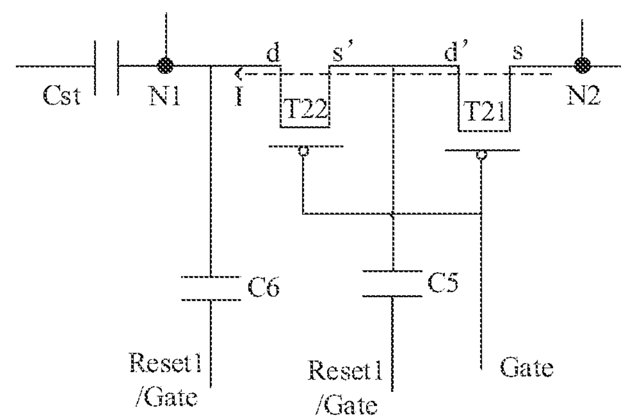
FIG. 30A is a schematic diagram of a second transistor in the pixel circuit in FIG. 29 in an on state.
Figure 30B:
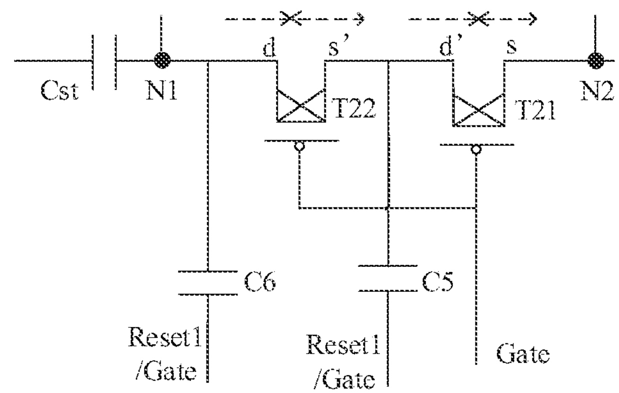
FIG. 30B is a schematic diagram of a second transistor in the pixel circuit in FIG. 29 in an off state.

As shown in FIGS. 30A and 30B, the sixth voltage stabilizing capacitor C6 is electrically connected to the first node N1, which is equivalent to that the sixth voltage stabilizing capacitor C6 is connected in parallel to the storage capacitor Cst. In the reset phase P1 and the input and compensation phase P2, while the storage capacitor Cst is charged, the sixth voltage stabilizing capacitor C6 is also charged. That is, a potential of the first end of the sixth voltage stabilizing capacitor C6 is the same as a potential of the first end of the storage capacitor Cst. When entering the light-emitting phase P3, even if the second transistor T2 (the third sub-transistor T21 and the fourth sub-transistor T22) has a leakage current, charges stored in the sixth voltage stabilizing capacitor C6 may provide some charges to the first node N1, so as to compensate for a voltage drop caused by the leakage current of the second transistor T2. It is equivalent to enhancing charges storage capability of the storage capacitor Cst by providing the sixth voltage stabilizing capacitor C6. Therefore, the potential of the first node N1 may be kept stable, and a voltage difference between the first electrode and the second electrode of the second transistor T2 may be reduced, thereby reducing the leakage current of the second transistor T2. For an operating principle of the second voltage stabilizing capacitor C2, reference may be made to the description of the operating principle of the sixth voltage stabilizing capacitor C6, which will not be repeated herein.

Figure 22:
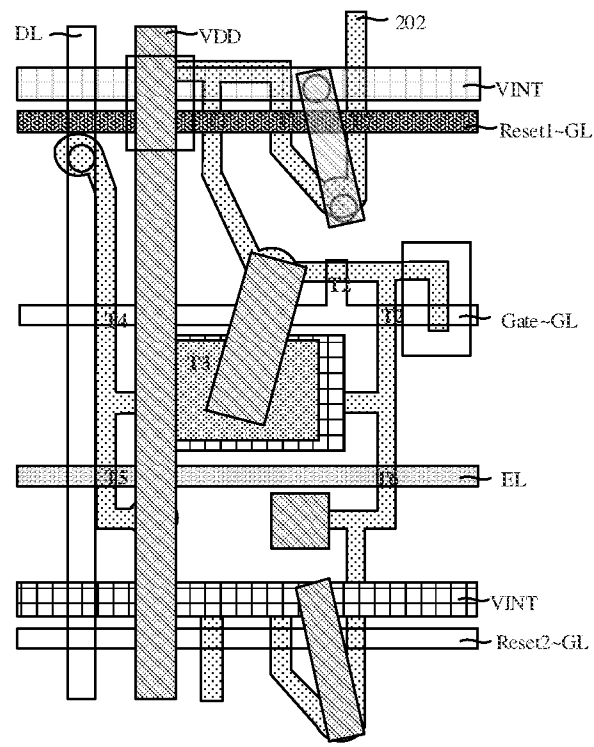
FIG. 22 is an overall layout of yet another pixel circuit, in accordance with some embodiments.

It will be noted that, the above embodiments of the present disclosure and FIGS. 15 to 21 provide various pattern designs of the semiconductor layer 202. The present disclosure may further include other embodiments, as long as a function of suppressing the leakage current of the first switching transistor may be achieved. FIG. 22 is an overall structural diagram of the semiconductor layer 202, the first gate layer 204, the second gate layer 206 and the source-drain metal layer 208. In the semiconductor layer 202, the active layer of the first transistor T1 includes an active layer body and an extension portion, and the active layer of the second transistor T2 includes an active layer body and an extension portion. Patterns of remaining layers are not changed relative to FIG. 11. Overall structural diagrams of a plurality of structures may be obtained as long as the semiconductor layer 202 in FIG. 22 is replaced with one of the semiconductor layers 202 shown in FIGS. 15 to 21.

The following describes the case where the first switching transistor is the single-gate transistor.

Figure 23:
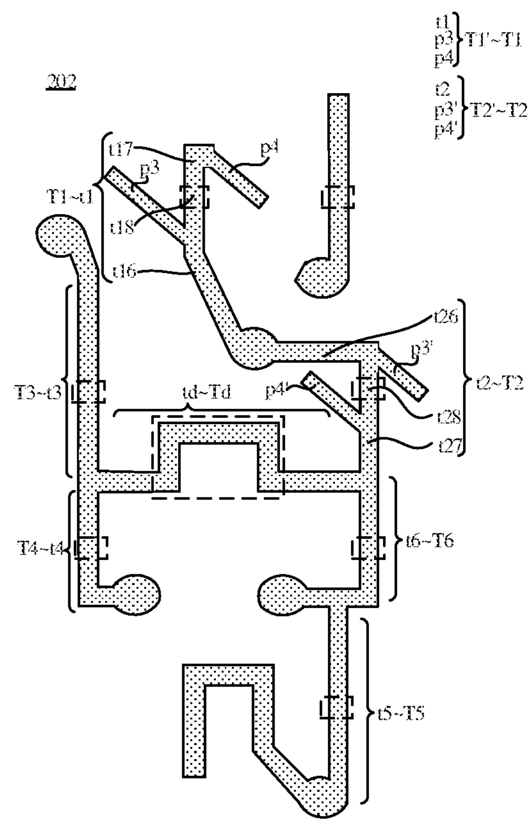
FIG. 23 is a diagram showing a structure of yet another semiconductor layer, in accordance with some embodiments.
Figure 24:
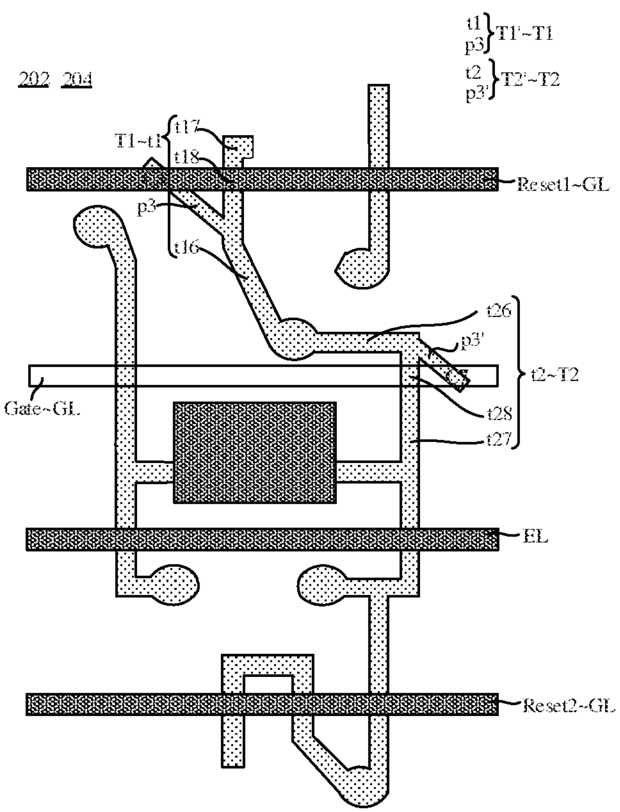
FIG. 24 is a diagram showing structures of yet another semiconductor layer and yet another first gate layer, in accordance with some embodiments.
Figure 25:
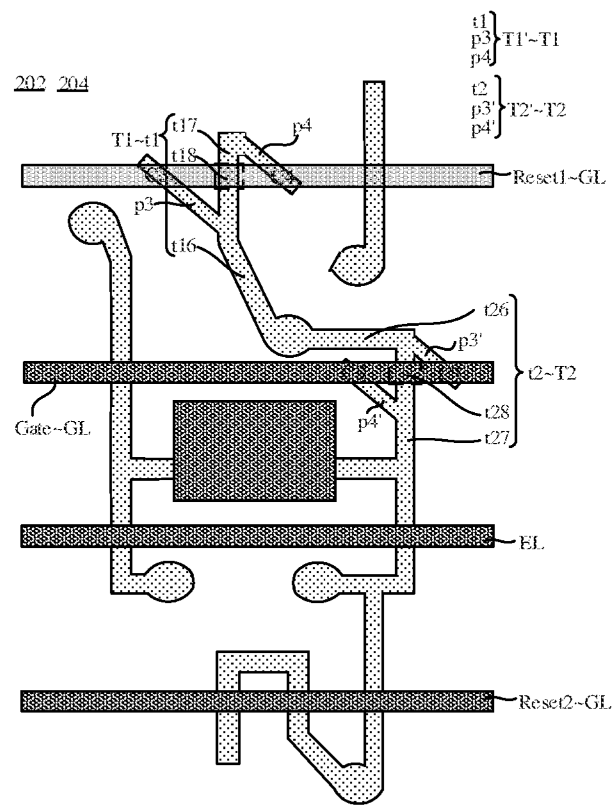
FIG. 25 is a diagram showing structures of yet another semiconductor layer and yet another first gate layer, in accordance with some embodiments.

As shown in FIGS. 23 to 25, in some embodiments, the active layer body (t1 or t2) of the first switching transistor (T1 or T2) includes a third channel portion (t18 or t28), a fourth conductive portion (t16 or t26) and a fifth conductive portion (t17 or t27). The fourth conductive portion (t16 or t26) and the fifth conductive portion (t17 or t27) are located on opposite sides of the third channel portion (t18 or t28). The orthogonal projection of the gate control line GL on the base 201 is overlapped with an orthogonal projection of the third channel portion of the first switching transistor on the base 201. The fourth conductive portion (t16 or t26) is electrically connected to the control electrode of the driving transistor Td.

The active layer (T1' or T2') of the first switching transistor (T1 or T2) includes at least one third extension portion (p3 or p3'). The third extension portion (p3 or p3') is electrically connected to the fourth conductive portion (t16 or t26), and at least a portion of an orthogonal projection of the third extension portion (p3 or p3') on the base 201 is overlapped with the orthogonal projection of the gate control line GL on the base 201. Overlapping portions of the third extension portion (p3 or p3') and the gate control line GL constitute a voltage stabilizing capacitor. The gate control line GL includes the first reset signal line Reset1 or the gate scan line Gate.

In some embodiments, the active layer (T1' or T2') of the first switching transistor (T1 or T2) further includes at least one fourth extension portion (p4 or p4'). The fourth extension portion (p4 or p4') is electrically connected to the fifth conductive portion (t17 or t27), and at least a portion of an orthogonal projection of the fourth extension portion (p4 or p4') on the base 201 is overlapped with the orthogonal projection of the gate control line GL on the base 201.

For example, the active layer of the first switching transistor includes one third extension portion or fourth extension portion, two third extension portions or fourth extension portions, or three third extension portions or fourth extension portions. Overlapping portions of the third extension portion(s) of the first switching transistor and the gate control line GL constitute one voltage stabilizing capacitor, two voltage stabilizing capacitors or three voltage stabilizing capacitors. In a case where the active layer of the first switching transistor includes a plurality of third extension portions/fourth extension portions, and the overlapping portions of the plurality of third extension portions or fourth extension portions of the first switching transistor and the gate control line GL constitute a plurality of voltage stabilizing capacitors, voltage stability of ends, electrically connected to the first switching transistor, of the plurality of voltage stabilizing capacitors may be enhanced, thereby further enhancing the improvement effect on the leakage current of the first switching transistor. The embodiments of the present disclosure are described by taking an example in which the active layer of the first switching transistor includes one third extension portion and one fourth extension portion.

In the following, the active layer of the first switching transistor is described by taking an example in which the first switching transistor is the first transistor T1 or the second transistor T2.

For example, as shown in FIG. 24, the first switching transistor is the first transistor T1, and the first transistor T1 is a single-gate transistor. The active layer body t1 of the first transistor T1 includes a third channel portion t18, a fourth conductive portion t16 and a fifth conductive portion t17. The fourth conductive portion t16 and the fifth conductive portion t17 are located on opposite sides of the third channel portion t18. The fourth conductive portion t16 is electrically connected to the control electrode of the driving transistor Td, and the third extension portion p3 of the first transistor T1 is electrically connected to the fourth conductive portion t16 of the first transistor T1. At least a portion of an orthogonal projection of the third extension portion p3 of the first transistor T1 on the base 201 is overlapped with the orthogonal projection of the first reset signal line Reset1 on the base 201. Overlapping portions of the third extension portion p3 and the first reset signal line Reset1 constitute a third voltage stabilizing capacitor C3.

In some examples, as shown in FIG. 25, the first transistor T1 further includes a fourth extension portion p4. The fourth extension portion p4 of the first transistor T1 is electrically connected to the fifth conductive portion t17 of the first transistor T1, and at least a portion of an orthogonal projection of the fourth extension portion p4 of the first transistor T1 on the base 201 is overlapped with the orthogonal projection of the first reset signal line Reset1 on the base 201. Overlapping portions of the fourth extension portion p4 and the first reset signal line Reset1 constitute a fourth voltage stabilizing capacitor C4.

For example, as shown in FIG. 24, the first switching transistor is the second transistor T2, and the second transistor T2 is a single-gate transistor. The active layer body t2 of the second transistor T2 includes a third channel portion t28, a fourth conductive portion t26 and a fifth conductive portion t27. The fourth conductive portion t26 and the fifth conductive portion t27 are located on opposite sides of the third channel portion t28. The fourth conductive portion t26 is electrically connected to the control electrode of the driving transistor Td, and the third extension portion p3' of the second transistor T2 is connected to the fourth conductive portion t26 of the second transistor T2. Moreover, at least a portion of an orthogonal projection of the third extension portion p3' of the second transistor T2 on the base 201 is overlapped with the orthogonal projection of the gate scan line Gate on the base 201, and overlapping portions of the third extension portion p3' and the gate scan line Gate constitute a seventh voltage stabilizing capacitor C7.

In some examples, as shown in FIG. 25, the second transistor T2 further includes a fourth extension portion p4', and the fourth extension portion p4' of the second transistor T2 is electrically connected to the fifth conductive portion t27 of the second transistor T2. Moreover, at least a portion of an orthogonal projection of the fourth extension portion p4' of the second transistor T2 on the base 201 is overlapped with the orthogonal projection of the gate scan line Gate on the base 201, and overlapping portions of the fourth extension portion p4' and the gate scan line Gate constitute an eighth voltage stabilizing capacitor C8.

Figure 31:
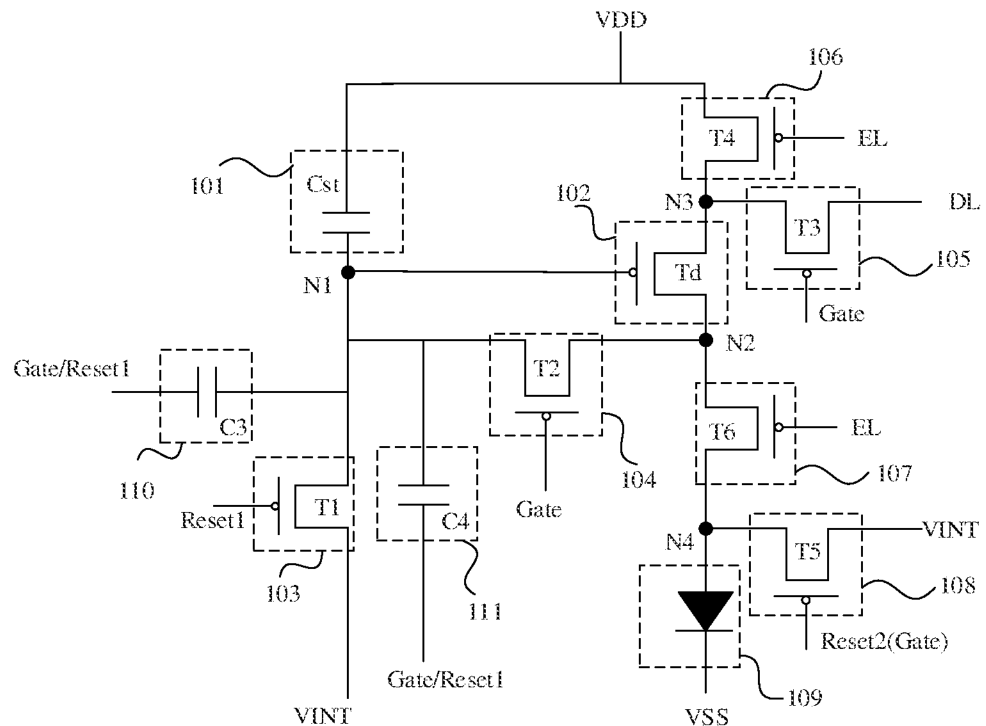
FIG. 31 is a diagram showing a structure of yet another sub-pixel, in accordance with some embodiments.
Figure 32:
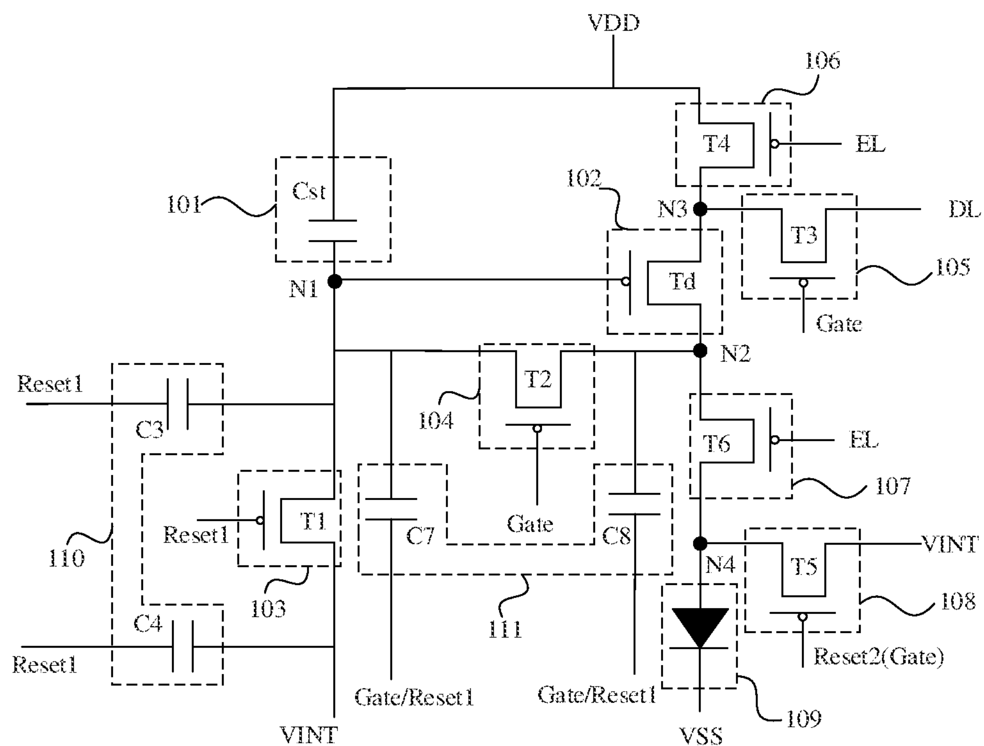
FIG. 32 is a diagram showing a structure of yet another sub-pixel, in accordance with some embodiments.

As shown in FIGS. 31 and 32, corresponding to the above pattern design of the active layer of the first switching transistor, in the pixel circuit 100 provided by some embodiments of the present disclosure, for the case where the first switching transistor is the single-gate transistor, the first voltage stabilizing sub-circuit 110 includes at least one third voltage stabilizing capacitor C3, and the second voltage stabilizing sub-circuit 111 includes at least one seventh voltage stabilizing capacitor C7. Alternatively, the first voltage stabilizing sub-circuit 110 includes at least one third voltage stabilizing capacitor C3 and at least one fourth voltage stabilizing capacitor C4, and the second voltage stabilizing sub-circuit 111 includes at least one seventh voltage stabilizing capacitor C7 and at least one eighth voltage stabilizing capacitor C8.

In a case where the first reset sub-circuit 103 includes the first transistor T1, and the first transistor T1 is a single-gate transistor, the control electrode of the first transistor T1 is electrically connected to the first reset signal line Reset1, the first electrode of the first transistor T1 is electrically connected to the initialization signal line VINT, and the second electrode of the first transistor T1 is electrically connected to the control electrode of the driving transistor Td. A first end of the third voltage stabilizing capacitor C3 is electrically connected to the second electrode of the first transistor T1, and a second end of the third voltage stabilizing capacitor C3 is electrically connected to the first reset signal line Reset1 or the gate scan line Gate. A first end of the fourth voltage stabilizing capacitor C4 is electrically connected to the first electrode of the first transistor T1, and a second end of the fourth voltage stabilizing capacitor C4 is electrically connected to the first reset signal line Reset1 or the gate scan line Gate.

In a case where the compensation sub-circuit 104 includes the second transistor T2, and the second transistor T2 is the single-gate transistor, the control electrode of the second transistor T2 is electrically connected to the gate scan line Gate, the first electrode of the second transistor T2 is electrically connected to the second electrode of the driving transistor Td, and the second electrode of the second transistor T2 is electrically connected to the control electrode of the driving transistor Td. A first end of the seventh voltage stabilizing capacitor C7 is electrically connected to the second electrode of the second transistor T2, and a second end of the seventh voltage stabilizing capacitor C7 is electrically connected to the first reset signal line Reset1 or the gate scan line Gate. A first end of the eighth voltage stabilizing capacitor C8 is electrically connected to the first electrode of the second transistor T2, and a second end of the eighth voltage stabilizing capacitor C8 is electrically connected to the first reset signal line Reset1 or the gate scan line Gate.

Hereinafter, operating processes of the second transistor T2, the seventh voltage stabilizing capacitor C7 and the eighth voltage stabilizing capacitor C8 are taken as an example to describe a principle that the seventh voltage stabilizing capacitor C7 and the eighth voltage stabilizing capacitor C8 suppress the leakage current of the second transistor T2. Since structures of the first transistor T1, the third voltage stabilizing capacitor C3 and the fourth voltage stabilizing capacitor C4 are similar to structures of the second transistor T2, the seventh voltage stabilizing capacitor C7 and the eighth voltage stabilizing capacitor C8, for a principle that the third voltage stabilizing capacitor C3 and the fourth voltage stabilizing capacitor C4 suppress the leakage current of the first transistor T1, reference may be made to the following description, which will not be repeated herein.

Figure 33A:
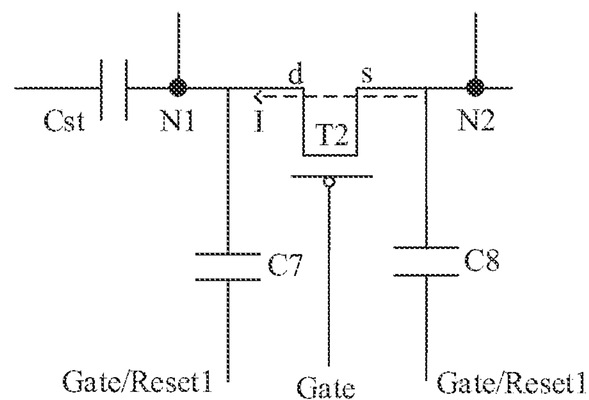
FIG. 33A is a schematic diagram of a second transistor in the pixel circuit in FIG. 32 in an on state.
Figure 33B:
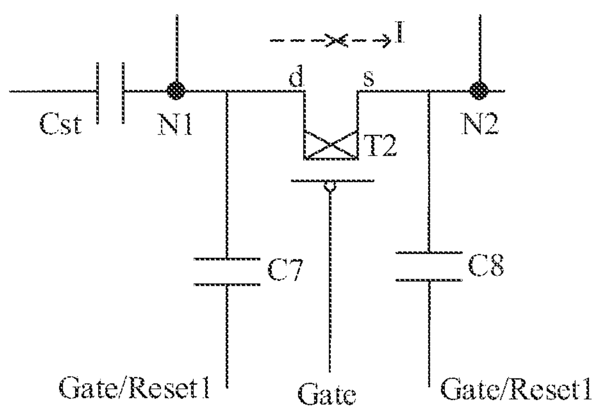
FIG. 33B is a schematic diagram of a second transistor in the pixel circuit in FIG. 32 in an off state.

As shown in FIGS. 33A and 33B, for convenience of description, in the following description, a potential of the first electrode of the second transistor T2 is $V_s$, a potential of the second electrode of the second transistor T2 is $V_d$, a potential of the first end of the seventh voltage stabilizing capacitor C7 is $V_{c7}$, and a potential of the first end of the eighth voltage stabilizing capacitor C8 is $V_{c8}$.

In the input and compensation phase P2, the second transistor T2 is turned on under the control of the gate scan signal to transmit the electrical signal I from the second node N2 to the first node N1. Upon the input and compensation phase P2 ends, the $V_s$ is greater than the $V_d$, the $V_{c7}$ is equal to or approximately equal to the $V_d$, and the $V_{c8}$ is equal to or approximately equal to the $V_s$. Moreover, due to the voltage holding function of the capacitor, the potential $V_{c7}$ of the first end of the seventh voltage stabilizing capacitor C7 and the potential $V_{c8}$ of the first end of the eighth voltage stabilizing capacitor C8 may both remain stable. In the light-emitting phase P3, the second transistor T2 is turned off under the control of the gate scan signal, and the potential $V_{c7}$ of the first end of the seventh voltage stabilizing capacitor C7 and the potential $V_{c8}$ of the first end of the eighth voltage stabilizing capacitor C8 are maintained. Therefore, the $V_s$ and the $V_d$ remain substantially unchanged, and the $V_s$ is still greater than the $V_d$. In this way, a current cannot flow from the second electrode of the second transistor T2 to the first electrode thereof, and a reverse leakage current of the first node N1 through the second transistor T2 may be suppressed, so that the voltage of the first node N1 may be maintained.

In addition, as shown in FIGS. 33A and 33B, the seventh voltage stabilizing capacitor C7 is electrically connected to the first node N1, which is equivalent to that the seventh voltage stabilizing capacitor C7 is connected in parallel to the storage capacitor Cst. In the reset phase P1 and the input and compensation phase P2, while the storage capacitor Cst is charged, the seventh voltage stabilizing capacitor C7 is also charged. That is, the potential of the first end of the seventh voltage stabilizing capacitor C7 is the same as a potential of the first end of the storage capacitor Cst. When entering the light-emitting phase P3, even if the second transistor T2 has a leakage current, charges stored in the seventh voltage stabilizing capacitor C7 may provide some charges to the first node N1, so as to compensate for a voltage drop caused by the leakage current of the second transistor T2. It is equivalent to enhancing charges storage capability of the storage capacitor Cst by providing the seventh voltage stabilizing capacitor C7. Therefore, the potential of the first node N1 may be kept stable, and the voltage difference between the first electrode and the second electrode of the second transistor T2 may be reduced, thereby reducing the leakage current of the second transistor T2. For an operating principle of the third voltage stabilizing capacitor C3, reference may be made to the description of the operating principle of the seventh voltage stabilizing capacitor C7, which will not be repeated herein.

Figure 26:
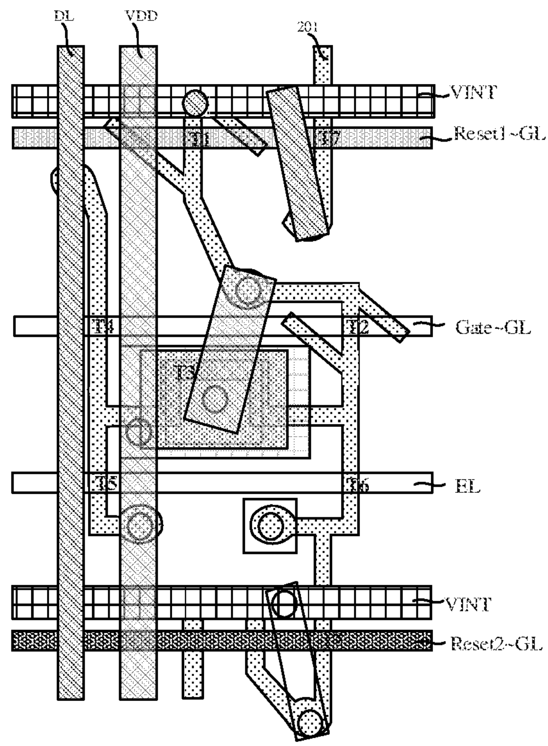
FIG. 26 is an overall layout of yet another pixel circuit, in accordance with some embodiments.

It will be noted that, the above embodiments of the present disclosure and FIGS. 23 to 25 provide various pattern designs of the semiconductor layer 202. The present disclosure may further include other embodiments, as long as a function of suppressing the leakage current of the first switching transistor may be achieved. FIG. 26 is an overall structural diagram of the semiconductor layer 202, the first gate layer 204, the second gate layer 206 and the source-drain metal layer 208. In the semiconductor layer 202, the active layer of the first transistor T1 includes an active layer body and an extension portion, and the active layer of the second transistor T2 includes an active layer body and an extension portion. Patterns of remaining layers are not changed relative to FIG. 12. A plurality of overall structural diagrams may be obtained as long as the semiconductor layer 202 in FIG. 26 is replaced with one of the semiconductor layers 202 shown in FIGS. 23 to 25.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:

a base;

a plurality of sub-pixels disposed on the base, each sub-pixel including a pixel circuit, the pixel circuit including a driving transistor and at least one first switching transistor, and the at least one first switching transistor being electrically connected to a control electrode of the driving transistor; and a plurality of gate control lines disposed on the base, each pixel circuit being electrically connected to at least two gate control lines, wherein:

a first switching transistor includes an active layer, the active layer includes an active layer body and at least one extension portion, and the active layer body includes at least one channel portion and at least one conductive portion; and an extension portion is electrically connected to a conductive portion of the active layer body, and at least a portion of an orthogonal projection of the extension portion on the base is overlapped with an orthogonal projection of a gate control line on the base, wherein:

the at least one extension portion includes at least one first extension portion;

the active layer body of the first switching transistor includes two channel portions and three conductive portions, and the three conductive portions and the two channel portions are electrically connected alternately in sequence;

the orthogonal projection of the gate control line on the base is overlapped with orthogonal projections of the two channel portions of the first switching transistor on the base; and a first extension portion of the first switching transistor is electrically connected to a conductive portion located between the two channel portions of the first switching transistor, and at least a portion of an orthogonal projection of the first extension portion of the first switching transistor on the base is overlapped with the orthogonal projection of the gate control line on the base.

2. The display panel according to claim 1, wherein: the three conductive portions of the first switching transistor are a first conductive portion, a second conductive portion and a third conductive portion, and the second conductive portion is located between the two channel portions of the first switching transistor;

one end of the first extension portion is electrically connected to the second conductive portion, and another end of the first extension portion extends in a direction away from the second conductive portion; and the first extension portion is located between the first conductive portion and the third conductive portion, or on a side of the active layer body of the first switching transistor.

3. The display panel according to claim 1, wherein: the at least one extension portion further includes at least one second extension portion;

one of two conductive portions, located at two ends, of the first switching transistor is electrically connected to the control electrode of the driving transistor; and a second extension portion of the first switching transistor is electrically connected to the conductive portion that is electrically connected to the control electrode of the driving transistor in the three conductive portions, and at least a portion of an orthogonal projection of the second extension portion of the first switching transistor on the base is overlapped with the orthogonal projection of the gate control line on the base.

4. The display panel according to claim 3, wherein: the three conductive portions of the first switching transistor are a first conductive portion, a second conductive portion and a third conductive portion, the second conductive portion is located between the two channel portions of the first switching transistor, and the first conductive portion is electrically connected to the control electrode of the driving transistor;

one end of the second extension portion is electrically connected to the first conductive portion, and another end of the second extension portion extends in a direction away from the first conductive portion; and the second extension portion is located between the first conductive portion and the third conductive portion, or on a side of the active layer body of the first switching transistor.

5. The display panel according to claim 1, further comprising:

a plurality of initialization signal lines, each pixel circuit being further electrically connected to at least one initialization signal line, wherein:

the at least two gate control lines electrically connected to the pixel circuit includes a first reset signal line;

the at least one first switching transistor includes a first transistor; a control electrode of the first transistor is electrically connected to the first reset signal line, a first electrode of the first transistor is electrically connected to an initialization signal line, and a second electrode of the first transistor is electrically connected to the control electrode of the driving transistor; and at least a portion of an orthogonal projection of an extension portion of the first transistor on the base is overlapped with an orthogonal projection of the first reset signal line on the base.

6. The display panel according to claim 5, wherein: the at least two gate control lines electrically connected to the pixel circuit further includes a gate scan line;

the at least one first switching transistor further includes a second transistor, a control electrode of the second transistor is electrically connected to the gate scan line, a first electrode of the second transistor is electrically connected to a second electrode of the driving transistor, and a second electrode of the second transistor is electrically connected to the control electrode of the driving transistor; and at least a portion of an orthogonal projection of an extension portion of the second transistor on the base is overlapped with an orthogonal projection of the gate scan line on the base or at least a portion of the orthogonal projection of the extension portion of the second transistor on the base is overlapped with the orthogonal projection of the first reset signal line on the base.

7. The display panel according to claim 1, further comprising a plurality of first voltage signal lines, a plurality of light-emitting control lines and a plurality of data lines, wherein:

the at least two gate control lines electrically connected to the pixel circuit includes a second reset signal line;

each pixel circuit is further electrically connected to a first voltage signal line;

the pixel circuit further includes a storage capacitor;

the storage capacitor including a first electrode plate and a second electrode plate arranged opposite to each other;

the first electrode plate and the plurality of gate control lines are disposed in a same layer, and the first electrode plate is electrically connected to the control electrode of the driving transistor;

the second electrode plate is disposed on a side of the first electrode plate away from the base, and the second electrode plate is electrically connected to the first voltage signal line;

each pixel circuit is electrically connected to a light-emitting control line, a data line and the second reset signal line; and the pixel circuit further includes at least one second switching transistor, and each second switching transistor is electrically connected to a first electrode or a second electrode of the driving transistor.

8. A display apparatus, comprising the display panel according to claim 1.

9. A pixel circuit, comprising:

a driving sub-circuit configured to generate a driving current;

a storage sub-circuit electrically connected to the driving sub-circuit and a first voltage signal line, wherein the storage sub-circuit is configured to store a received signal and maintain a potential of a terminal, connected to the driving sub-circuit, of the storage sub-circuit;

a first reset sub-circuit directly electrically connected to a first reset signal line, the driving sub-circuit and an initialization signal line, wherein the reset sub-circuit is configured to transmit an initialization signal received at the initialization signal line to the driving sub-circuit in response to a first reset signal received at the first reset signal line;

a compensation sub-circuit directly electrically connected to the driving sub-circuit and a gate scan line, wherein the compensation sub-circuit is configured to perform threshold compensation on the driving sub-circuit in response to a gate scan signal received at the gate scan line;

a first voltage stabilizing sub-circuit directly electrically connected to the first reset sub-circuit, and one of the first reset signal line and the gate scan line, wherein the first voltage stabilizing sub-circuit is configured to suppress a leakage current of the first reset sub-circuit; and a second voltage stabilizing sub-circuit directly electrically connected to the compensation sub-circuit, and one of the first reset signal line and the gate scan line, wherein the second voltage stabilizing sub-circuit is configured to suppress a leakage current of the compensation sub-circuit.

10. The pixel circuit according to claim 9, wherein: the driving sub-circuit includes a driving transistor, and the first voltage stabilizing sub-circuit includes at least one first voltage stabilizing capacitor;

the first reset sub-circuit includes a first sub-transistor and a second sub-transistor, a control electrode of the first sub-transistor is electrically connected to the first reset signal line, a first electrode of the first sub-transistor is electrically connected to the initialization signal line, and a second electrode of the first sub-transistor is electrically connected to a first electrode of the second sub-transistor, a control electrode of the second sub-transistor is electrically connected to the first reset signal line, and a second electrode of the second sub-transistor is electrically connected to a control electrode of the driving transistor; and a first end of the first voltage stabilizing capacitor is electrically connected to the second electrode of the first sub-transistor, and a second end of the first voltage stabilizing capacitor is electrically connected to the first reset signal line.

11. The pixel circuit according to claim 10, wherein: the first voltage stabilizing sub-circuit further includes at least one second voltage stabilizing capacitor; and a first end of the second voltage stabilizing capacitor is electrically connected to the second electrode of the second sub-transistor, and a second end of the second voltage stabilizing capacitor is electrically connected to the first reset signal line or the gate scan line.

12. The pixel circuit according to claim 9, wherein: the driving sub-circuit includes a driving transistor, and the first voltage stabilizing sub-circuit includes at least one third voltage stabilizing capacitor and at least one fourth voltage stabilizing capacitor;

the first reset sub-circuit includes a first transistor, a control electrode of the first transistor is electrically connected to the first reset signal line, a first electrode of the first transistor is electrically connected to the initialization signal line, and a second electrode of the first transistor is electrically connected to a control electrode of the driving transistor;

a first end of the third voltage stabilizing capacitor is electrically connected to the second electrode of the first transistor, and a second end of the third voltage stabilizing capacitor is electrically connected to the first reset signal line or the gate scan line; and a first end of the fourth voltage stabilizing capacitor is electrically connected to the first electrode of the first transistor, and a second end of the fourth voltage stabilizing capacitor is electrically connected to the first reset signal line or the gate scan line.

13. The pixel circuit according to claim 9, wherein: the driving sub-circuit includes a driving transistor; the second voltage stabilizing sub-circuit includes at least one fifth voltage stabilizing capacitor;

the compensation sub-circuit includes a third sub-transistor and a fourth sub-transistor, a control electrode of the third sub-transistor is electrically connected to the gate scan line, a first electrode of the third sub-transistor is electrically connected to a second electrode of the driving transistor, and a second electrode of the third sub-transistor is electrically connected to a first electrode of the fourth sub-transistor a control electrode of the fourth sub-transistor is electrically connected to the gate scan line, and a second electrode of the fourth sub-transistor is electrically connected to a control electrode of the driving transistor; and a first end of the fifth voltage stabilizing capacitor is electrically connected to the second electrode of the third sub-transistor, and a second end of the fifth voltage stabilizing capacitor is electrically connected to the first reset signal line or the gate scan line.

14. The pixel circuit according to claim 13, wherein: the second voltage stabilizing sub-circuit further includes at least one sixth voltage stabilizing capacitor; and a first end of the sixth voltage stabilizing capacitor is electrically connected to the second electrode of the fourth sub-transistor, and a second end of the sixth voltage stabilizing capacitor is electrically connected to the first reset signal line or the gate scan line.

15. The pixel circuit according to claim 9, wherein: the driving sub-circuit includes a driving transistor; the second voltage stabilizing sub-circuit includes at least one seventh voltage stabilizing capacitor and at least one eighth voltage stabilizing capacitor;

the compensation sub-circuit includes a second transistor, a control electrode of the second transistor is electrically connected to the gate scan line, a first electrode of the second transistor is electrically connected to a second electrode of the driving transistor, and a second electrode of the second transistor is electrically connected to a control electrode of the driving transistor;

a first end of the seventh voltage stabilizing capacitor is electrically connected to the second electrode of the second transistor, and a second end of the seventh voltage stabilizing capacitor is electrically connected to the first reset signal line or the gate scan line; and a first end of the eighth voltage stabilizing capacitor is electrically connected to the first electrode of the second transistor, and a second end of the eighth voltage stabilizing capacitor is electrically connected to the first reset signal line or the gate scan line.

16. The pixel circuit according to claim 9, further comprising:

a data writing sub-circuit electrically connected to the gate scan line, a data line and the driving sub-circuit, wherein the data writing sub-circuit is configured to transmit a data signal received at the data line to the driving sub-circuit in response to the gate scan signal received at the gate scan line; the driving sub-circuit and the compensation sub-circuit being further configured to transmit the data signal to the storage sub-circuit;

a second reset sub-circuit electrically connected to a second reset signal line, the initialization signal line and a light-emitting device, wherein the second reset sub-circuit is configured to transmit the initialization signal received at the initialization signal line to the light-emitting device in response to a second reset signal received at the second reset signal line;

a first light-emitting control sub-circuit electrically connected to a light-emitting control line, the first voltage signal line and the driving sub-circuit, wherein the first light-emitting control sub-circuit is configured to transmit a first voltage signal received at the first voltage signal line to the driving sub-circuit in response to a light-emitting control signal received at the light-emitting control line; and a second light-emitting control sub-circuit electrically connected to the light-emitting control line, the driving sub-circuit and the light-emitting device, wherein the second light-emitting control sub-circuit is configured to transmit the driving current generated by the driving sub-circuit to the light-emitting device, so as to control the light-emitting device to emit light.

* * * * *